(12) United States Patent
Welch et al.

(10) Patent No.: US 8,921,869 B2
(45) Date of Patent: Dec. 30, 2014

(54) METHOD OF PROVIDING LIGHT EMITTING DEVICE

(71) Applicant: Cree, Inc., Durham, NC (US)

(72) Inventors: Erin R. F. Welch, Chapel Hill, NC (US); Christopher P. Hussell, Cary, NC (US); Jesse Colin Reiherzer, Wake Forest, NC (US); Joseph G. Clark, Raleigh, NC (US)

(73) Assignee: Cree, Inc., Durham, NC ( * ) Notice: Subject to any disclaimer, the term of this patent is extended or adjusted under 35 U.S.C. 154(b) by 0 days.

(21) Appl. No.: 13/908,597

(22) Filed: Jun. 3, 2013

(65) Prior Publication Data

US 2013/0334548 A1 Dec. 19, 2013

Related U.S. Application Data

(60) Division of application No. 13/336,540, filed on Dec. 23, 2011, now Pat. No. 8,455,908, which is a continuation-in-part of application No. 13/028,972, filed on Feb. 16, 2011, now Pat. No. 8,564,000, and a continuation-in-part of application No. 13/104,558, filed on May 10, 2011, now Pat. No. 8,624,271.

(51) Int. Cl.
*H01L 27/15* (2006.01)

(52) U.S. Cl.
USPC ............... 257/81; 257/88; 257/89; 257/99; 257/E21.592; 313/503

(58) Field of Classification Search
CPC ............ H01L 21/0242; H01L 21/02458; H01L 33/64; H01L 21/0254; H01L 21/02521; H01L 21/02546; H01L 21/02579; H01L 21/0262; H01L 21/02642; H01L 21/02647; H01L 33/007; H01L 33/641; H01L 21/0237; Y10S 977/742

USPC ............... 257/12–13, 81, 84, 87–89, 98–100, 257/347–348, 433–434; 313/112, 501, 503, 313/506–507

See application file for complete search history.

(56) References Cited

U.S. PATENT DOCUMENTS 4,855,194 A  8/1989 Wright
4,946,547 A  8/1990 Palmour (Continued)

FOREIGN PATENT DOCUMENTS

CN  ZL 2011-30139847.5  8/2012
CN  ZL 2011-30166527.9  8/2012

(Continued)

OTHER PUBLICATIONS

Bridgelux Product Data Sheet—1 page.

(Continued)

*Primary Examiner* — Dung A. Le
(74) *Attorney, Agent, or Firm* — Jenkins, Wilson, Taylor & Hunt, P.A.

(57) ABSTRACT

Light emitting devices and methods are disclosed. In one embodiment a light emitting device can include a submount and a plurality of light emitting diodes (LEDs) disposed over the submount. At least a portion of the submount can include a reflective layer at least partially disposed below a solder mask. One or more layers within the submount may include one or more holes, a rough surface texture, or combinations thereof to improve adhesion within the device. The device can further include a retention material dispensed about the plurality of LEDs. Devices and methods are disclosed for improved solder mask adhesion.

16 Claims, 21 Drawing Sheets

FIG.21

(56) References Cited

U.S. PATENT DOCUMENTS

| | | |
|---|---|---|
| 5,200,022 A | 4/1993 | Kong |
| 5,210,051 A | 5/1993 | Carter, Jr. et al. |
| RE34,861 E | 2/1995 | Davis et al. |
| 5,393,993 A | 2/1995 | Edmond et al. |
| 5,523,589 A | 6/1996 | Edmond et al. |
| 6,093,053 A | 7/2000 | Horioka et al. |
| 6,224,430 B1 | 5/2001 | Kusuda et al. |
| 6,548,832 B1 | 4/2003 | Sakamoto et al. |
| 6,909,051 B2 | 6/2005 | Noble |
| 7,034,778 B1 | 4/2006 | Hähl |
| 7,055,987 B2 | 6/2006 | Staufert |
| D528,672 S | 9/2006 | Nagai |
| D541,761 S | 5/2007 | Saito et al. |
| 7,213,940 B1 | 5/2007 | Van de Ven et al. |
| 7,224,000 B2 | 5/2007 | Aanegola et al. |
| D570,506 S | 6/2008 | Uemoto |
| D570,797 S | 6/2008 | Song |
| D573,553 S | 7/2008 | Uemoto et al. |
| D573,731 S | 7/2008 | Uemoto |
| 7,393,237 B2 | 7/2008 | Kuo |
| D576,576 S | 9/2008 | Shida et al. |
| 7,479,660 B2 | 1/2009 | Kobilke |
| 7,482,636 B2 | 1/2009 | Murayama et al. |
| D586,303 S | 2/2009 | Fuwa et al. |
| D589,470 S | 3/2009 | Chen |
| D591,248 S | 4/2009 | Imai et al. |
| D592,615 S | 5/2009 | Imai et al. |
| D593,043 S | 5/2009 | Song |
| D602,451 S | 10/2009 | Gielen |
| D603,813 S | 11/2009 | Nishimura et al. |
| D607,420 S | 1/2010 | Imai et al. |
| D615,051 S | 5/2010 | Chen et al. |
| D615,052 S | 5/2010 | Imai et al. |
| D618,635 S | 6/2010 | Imai et al. |
| 7,780,313 B2 | 8/2010 | Lam et al. |
| 7,804,147 B2 | 9/2010 | Tarsa et al. |
| 7,825,578 B2 | 11/2010 | Takashima et al. |
| D630,171 S | 1/2011 | Hsieh |
| 7,872,418 B2 | 1/2011 | Hata et al. |
| D636,899 S | 4/2011 | Shibahara |
| D637,564 S | 5/2011 | Tseng et al. |
| 7,943,952 B2 | 5/2011 | Loh et al. |
| 7,955,147 B1 | 6/2011 | Legrady et al. |
| D640,997 S | 7/2011 | Imai et al. |
| 7,994,518 B2 | 8/2011 | Wang et al. |
| D645,417 S | 9/2011 | Imai et al. |
| 8,044,418 B2 | 10/2011 | Loh et al. |
| 8,058,088 B2 | 11/2011 | Cannon |
| D650,760 S | 12/2011 | Hussell et al. |
| 8,119,534 B2 | 2/2012 | Tanaka et al. |
| D658,601 S | 5/2012 | Egawa et al. |
| D658,602 S | 5/2012 | Egawa et al. |
| D658,603 S | 5/2012 | Egawa et al. |
| 8,167,674 B2 | 5/2012 | Hussell et al. |
| D667,803 S | 9/2012 | Hussell et al. |
| D669,041 S | 10/2012 | Imai et al. |
| D676,000 S | 2/2013 | Hussell et al. |
| D676,395 S | 2/2013 | Hussell et al. |
| 8,410,679 B2 | 4/2013 | Ibbetson et al. |
| 8,425,271 B2 | 4/2013 | Hussell et al. |
| D683,708 S | 6/2013 | Sasano et al. |
| 8,455,908 B2 | 6/2013 | Welch et al. |
| 8,461,613 B2 | 6/2013 | Chou et al. |
| 8,517,572 B2 | 8/2013 | Ferenc |
| D689,451 S | 9/2013 | Shimonishi et al. |
| 8,563,339 B2 | 10/2013 | Tarsa |
| 8,564,000 B2 | 10/2013 | Hussell |
| 8,575,639 B2 | 11/2013 | Hussell |
| 8,624,271 B2 | 1/2014 | Reiherzer |
| D702,653 S | 4/2014 | Wilcox et al. |
| D705,181 S | 5/2014 | Hussell et al. |
| 8,729,589 B2 | 5/2014 | Hussell et al. |
| D706,231 S | 6/2014 | Hussell et al. |
| D707,192 S | 6/2014 | Hussell et al. |
| 8,809,880 B2 | 8/2014 | Hussell |
| D712,850 S | 9/2014 | Welch et al. |
| 2004/0196663 A1 | 10/2004 | Ishida et al. |
| 2005/0152145 A1 | 7/2005 | Currie et al. |
| 2005/0199899 A1 | 9/2005 | Lin et al. |
| 2005/0264172 A1 | 12/2005 | Wojnarowski et al. |
| 2006/0139595 A1 | 6/2006 | Koenen et al. |
| 2006/0147746 A1 | 7/2006 | Wakako et al. |
| 2006/0186418 A1 | 8/2006 | Edmond |
| 2007/0018295 A1 | 1/2007 | Kim et al. |
| 2007/0029569 A1 | 2/2007 | Andrews |
| 2007/0158668 A1 | 7/2007 | Tarsa |
| 2007/0194336 A1 | 8/2007 | Shin et al. |
| 2007/0241345 A1 | 10/2007 | Huang |
| 2007/0246730 A1 | 10/2007 | Oishi et al. |
| 2008/0026498 A1 | 1/2008 | Tarsa et al. |
| 2008/0054279 A1 | 3/2008 | Hussell et al. |
| 2008/0054284 A1 | 3/2008 | Hussell et al. |
| 2008/0054286 A1 | 3/2008 | Loh et al. |
| 2008/0078664 A1 | 4/2008 | Schmidt et al. |
| 2008/0079017 A1 | 4/2008 | Loh et al. |
| 2008/0089072 A1 | 4/2008 | Kim et al. |
| 2008/0106723 A1 | 5/2008 | Hoogendam et al. |
| 2008/0173884 A1 | 7/2008 | Chitnis |
| 2008/0179611 A1 | 7/2008 | Chitnis |
| 2008/0191222 A1 | 8/2008 | Lee |
| 2008/0224166 A1 | 9/2008 | Glovatsky et al. |
| 2008/0239318 A1 | 10/2008 | Den Boef et al. |
| 2008/0258130 A1 | 10/2008 | Bergmann |
| 2009/0009103 A1 | 1/2009 | McKechnie et al. |
| 2009/0023323 A1 | 1/2009 | Lin et al. |
| 2009/0122514 A1 | 5/2009 | Yoon et al. |
| 2009/0130889 A1 | 5/2009 | Daily et al. |
| 2009/0166657 A1 | 7/2009 | Yamada et al. |
| 2009/0239409 A1 | 9/2009 | Bishop |
| 2009/0261374 A1 | 10/2009 | Hayashi |
| 2009/0262527 A1 | 10/2009 | Chou |
| 2009/0289169 A1 | 11/2009 | Yang et al. |
| 2009/0315061 A1 | 12/2009 | Andrews |
| 2010/0078664 A1 | 4/2010 | Helbing |
| 2010/0096642 A1 | 4/2010 | Chang et al. |
| 2010/0139836 A1 | 6/2010 | Horikoshi |
| 2010/0141182 A1 | 6/2010 | Shi |
| 2010/0155763 A1 | 6/2010 | Donofrio |
| 2010/0193822 A1 | 8/2010 | Inobe et al. |
| 2010/0253248 A1 | 10/2010 | Shi |
| 2010/0270567 A1 | 10/2010 | Emerson et al. |
| 2010/0320483 A1 | 12/2010 | Kadotani et al. |
| 2011/0013400 A1 | 1/2011 | Kanno et al. |
| 2011/0065241 A1* | 3/2011 | Lin et al. .................. 438/118 |
| 2011/0068674 A1 | 3/2011 | Takenaka et al. |
| 2011/0068696 A1 | 3/2011 | Van de Ven et al. |
| 2011/0068702 A1 | 3/2011 | Van de Ven et al. |
| 2011/0116275 A1 | 5/2011 | Sheek |
| 2011/0121323 A1 | 5/2011 | Wu et al. |
| 2011/0127912 A1 | 6/2011 | Lee et al. |
| 2011/0128730 A1 | 6/2011 | Chiu |
| 2011/0136394 A1 | 6/2011 | Mostoller et al. |
| 2011/0291151 A1 | 12/2011 | Matsuda et al. |
| 2012/0126255 A1 | 5/2012 | Hussell et al. |
| 2012/0126257 A1 | 5/2012 | Reiherzer et al. |
| 2012/0193651 A1 | 8/2012 | Edmond |
| 2012/0205689 A1 | 8/2012 | Welch |
| 2012/0241807 A1 | 9/2012 | Hoetzl et al. |
| 2012/0250310 A1 | 10/2012 | Hussell et al. |
| 2012/0299022 A1 | 11/2012 | Hussell |
| 2013/0058099 A1 | 3/2013 | Shum et al. |
| 2013/0207130 A1 | 8/2013 | Reiherzer |
| 2013/0207142 A1 | 8/2013 | Reiherzer |
| 2013/0256711 A1 | 10/2013 | Joo et al. |
| 2014/0097453 A1 | 4/2014 | Hussell et al. |
| 2014/0097454 A1 | 4/2014 | Hussell |
| 2014/0183577 A1 | 7/2014 | Hussell et al. |
| 2014/0217433 A1 | 8/2014 | Tudorica et al. |
| 2014/0240974 A1 | 8/2014 | Hussell et al. |

FOREIGN PATENT DOCUMENTS

| | | |
|---|---|---|
| CN | ZL201230099913.5 | 11/2012 |
| CN | ZL201230099954.4 | 12/2012 |

(56) References Cited

FOREIGN PATENT DOCUMENTS

| | | |
|---|---|---|
| CN | ZL201230099981.1 | 12/2012 |
| CN | ZL 201230472866.4 | 5/2013 |
| CN | ZL201230130915.6 | 10/2013 |
| CN | ZL201230652790.3 | 10/2013 |
| CN | ZL201230652789.0 | 11/2013 |
| CN | ZL201230652840.8 | 11/2013 |
| CN | ZL201330361367.2 | 1/2014 |
| EP | 2327930 | 6/2011 |
| EP | 2 643 861 | 10/2013 |
| EP | 2 643 862 | 10/2013 |
| EP | 2751471 | 7/2014 |
| JP | 07-038940 | 9/1995 |
| JP | 10-311937 | 11/1998 |
| JP | 2001-294083 | 10/2001 |
| JP | 2005-266117 | 9/2005 |
| JP | 2006-294898 | 10/2006 |
| JP | 2007-227680 | 9/2007 |
| JP | 2007-266357 | 10/2007 |
| JP | 2007-323857 | 12/2007 |
| JP | 2007-335371 | 12/2007 |
| JP | 2009-044055 | 2/2009 |
| JP | 2009-289918 | 12/2009 |
| JP | 2010-009972 | 1/2010 |
| JP | 1476166 | 7/2013 |
| JP | 1476175 | 7/2013 |
| JP | 1493219 | 2/2014 |
| KR | 3004423910000 | 3/2007 |
| KR | 10-0793338 | 1/2008 |
| KR | 10-2008-0092239 | 10/2008 |
| KR | 10-2009-0011121 | 2/2009 |
| KR | 10-2011-0004632 | 1/2011 |
| TW | 113260 | 10/2006 |
| TW | 124444 | 8/2008 |
| TW | 128526 | 5/2009 |
| TW | D141645 | 7/2011 |
| TW | D144159 | 12/2011 |
| TW | D156539 | 10/2013 |
| TW | D159325 | 3/2014 |
| TW | D159326 | 3/2014 |
| TW | D159849 | 4/2014 |
| TW | D159850 | 4/2014 |
| TW | D159851 | 4/2014 |
| TW | D160508 | 5/2014 |
| TW | D160509 | 5/2014 |
| TW | D160580 | 5/2014 |
| TW | D160581 | 5/2014 |
| TW | D160850 | 6/2014 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |
| WO | WO 2013/122831 | 8/2013 |

OTHER PUBLICATIONS

Citizen Co. Product Data Sheet—4 pages http://ce.citizen.co.jp/lighting_led/en/products/index.html.
U.S. Appl. No. 29/379,636 for "Light Emitting Device Package" filed Nov. 22, 2010.
Design U.S. Appl. No. 29/380,387 for "Light Emitting Device Package" filed Dec. 3, 2010.
U.S. Appl. No. 13/028,972 for "Light Emitting Devices and Methods" filed Feb. 16, 2011.
U.S. Appl. No. 13/104,558 for "Light Emitting Devices and Methods" filed May 10, 2011.
Notice of Allowance for U.S. Appl. No. 29/379,636 dated Aug. 4, 2011.
Design U.S. Appl. No. 29/404,913 for "Light Emitting Device Component" filed Oct. 26, 2011.
U.S. Appl. No. 13/224,850 for "Light Emitting Device Component" filed Sep. 2, 2011.
Design U.S. Appl. No. 29/379,636 for "Light Emitting Device Package" filed Nov. 22, 2011.
Design U.S. Appl. No. 29/408,955 for "Light Emitting Device Package" filed Dec. 19, 2011.
U.S. Appl. No. 13/336,540 dated Dec. 23, 2011.
Notification of Granting Patent Right for Design for Application Serial No. CN 2011/30166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.
Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
International Search Report and Written Opinion for Application Serial No. PCT/US2011/058596 dated Jun. 18, 2012.
Chinese Office Action for Application Serial No. CN 2012/30130915.5 dated Jul. 12, 2012.
Office Action/Restriction Requirement for U.S. Appl. No. 13/028,972 dated Jul. 25, 2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
Taiwanese Search Report for Application No. 101302309 dated Jan. 14, 2013.
Taiwanese Office Action for Application No. 101302309 dated Jan. 23, 2013.
Chinese Decision to Grant for Application No. 201230472866.4 dated Jan. 24, 2013.
Notice of Allowance for U.S. Appl. No. 13/336,540 dated Jan. 31, 2013.
Restriction Requirement for U.S. Appl. No. 13/671,089 dated Feb. 7, 2013.
Restriction Requirement for U.S. Appl. No. 29/404,913 dated Feb. 15, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.
International Search Report and Written Opinion for Application No. PCT/US2012/070589 dated Apr. 22, 2013.

(56) References Cited

OTHER PUBLICATIONS

International Search Report and Written Opinion for Application No. PCT/US2013/025307 dated May 15, 2013.
Notice of Allowance for U.S. Appl. No. 13/028,972 dated May 23, 2013.
Japanese Office Action for Application No. 2012-031549 dated Jun. 4, 2013.
Japanese Decision of Registration for Application No. 2012-023963 dated Jun. 4, 2013.
Japanese Decision of Registration for Application No. 2012-026117 dated Jun. 4, 2013.
Taiwanese Notice of Allowance for Application No. 101302309 dated Jun. 5, 2013.
Notice of Allowance for U.S. Appl. No. 13/435,912 dated Jun. 19, 2013.
Notice of Allowance for U.S. Appl. No. 29/404,913 dated Jun. 25, 2013.
Chinese Notice of Grant for Application No. 201230652790.3 dated Jun. 26, 2013.
Notice of Allowance for Application No. 13/104,558 dated Jul. 1, 2013.
Chinese Notice of Grant for Application No. 201230130915.6 dated Jul. 3, 2013.
Chinese Decision to Grant for Application No. 201230652789 dated Jul. 17, 2013.
U.S. Appl. No. 11/656,759 dated Jan. 22, 2007.
U.S. Appl. No. 11/899,790 dated Sep. 7, 2007.
U.S. Appl. No. 12/014,404 dated Jan. 15, 2008.
U.S. Appl. No. 12/717,048 dated Mar. 3, 2010.
U.S. Appl. No. 11/473,089 dated Jun. 21, 2006.
Notice of Allowance for U.S. Appl. No. 29/451,177 dated Apr. 25, 2014.
Restriction Requirement for U.S. Appl. No. 14/148,102 dated Apr. 24, 2014.
Notice of Publication for U.S. Appl. No. 14/043,494 dated Apr. 10, 2014.
Notice of Publication for U.S. Appl. No. 14/052,201 dated Apr. 10, 2014.
Koren Notice of Allowance for Application No. 30-2012-0020196 dated Apr. 21, 2014.
Koren Notice of Allowance for Application No. 30-2012-0020197 dated Apr. 21, 2014.
Final Office Action for U.S. Appl. No. 13/224,850 dated May 30, 2014.
Online definition of the term "non-linear", http://thefreedictionary.com/nonlinear, accessed on May 17, 2014.
Taiwanese Search Report for Application No. 102301394 dated Jul. 9, 2013.
Taiwanese Office Action for Application No. 102301394 dated Jul. 15, 2013.
Chinese Notice of Grant for Application No. 201230652840.3 dated Jul. 26, 2013.
Ex Parte Quayle Action for U.S. Appl. No. 13/671,089 dated Aug. 13, 2013.
Korean Office Action for Application No. 30-2012-0020196 dated Aug. 13, 2013.
Koren Office Action for Application 30-2012-0020197 dated Aug. 13, 2013.
Korean Office Action for Application No. 30-2012-0020198 dated Aug. 13, 2013.
Notice of Allowance for U.S. Appl. No. 13/104,558 dated Aug. 28, 2013.
Non-Final Office Action for U.S. Appl. No. 13/224,850 dated Sep. 5, 2013.
Taiwanese Search Report for Application No. 102300059 dated Apr. 17, 2013.
Taiwanese Search Report for Application No. 102300058 dated Apr. 29, 2013.
Taiwanese Office Action for Application No. 102300058 dated Aug. 27, 2013.
Taiwanese Office Action for Application No. 102301581 dated Sep. 6, 2013.
Taiwanese Office Action for Application No. 102301582 dated Sep. 6, 2013.
Taiwanese Office Action for Application No. 102301583 dated Sep. 6, 2013.
Taiwanese Office Action for Application No. 102301584 dated Sep. 6, 2013.
Taiwanese Office Action for Application No. 102301585 dated Sep. 6, 2013.
Restriction Requirement for U.S. Appl. No. 13/793,882 dated Sep. 20, 2013.
Restriction Requirement for U.S. Appl. No. 29/417,220 dated Sep. 27, 2013.
Restriction Requirement for U.S. Appl. No. 29/451,177 dated Sep. 27, 2013.
Restriction Requirement for U.S. Appl. No. 29/425,831 dated Sep. 30, 2013.
Taiwanese Office Action for Application No. 102300059 dated Oct. 1, 2013.
Chinese Notice to Grant for Application No. 201330361367.2 dated Oct. 8, 2013.
Notice of Allowance for U.S. Appl. No. 13/671,089 dated Oct. 22, 2013.
Restriction Requirement for U.S. Appl. No. 29/412,166 dated Oct. 25, 2013.
Restriction Requirement for U.S. Appl. No. 29/412,168 dated Oct. 25, 2013.
Non-Final Office Action for U.S. Appl. No. 13/793,882 dated Nov. 15, 2013.
Taiwanese Notice of Allowance for Application No. 102301582 dated Jan. 13, 2014.
Taiwanese Notice of Allowance for Application No. 102301584 dated Jan. 13, 2014.
Japanese Decision of Registration for Application No. 2013-018279 dated Jan. 15, 2014.
Taiwanese Notice of Allowance for Application No. 102300058 dated Jan. 17, 2014.
Taiwanese Notice of Allowance for Application No. 102300059 dated Jan. 17, 2014.
Korean Notice of Rejection for Application No. KR 30-2012-0020198 dated Jan. 14, 2014.
Taiwanese Notice of Allowance for Application No. 101307667 dated Feb. 7, 2014.
Supplemental Notice of Allowance for U.S. Appl. No. 29/404,913 dated Feb. 20, 2014.
Notice of Allowance for U.S. Appl. No. 13/793,882 dated Mar. 12, 2014.
Restriction Requirement for U.S. Appl. No. 14/043,494 dated Mar. 20, 2014.
Restriction Requirement for U.S. Appl. No. 14/052,201 dated Mar. 20, 2014.
Non-Final Office Action for U.S. Appl. No. 13/282,172 dated Mar. 21, 2014.
Japanese Office Action for Application No. 2012-031548 dated Nov. 5, 2013.
Japanese Office Action for Application No. 2012-031549 dated Nov. 5, 2013.
Taiwanese Notice of Allowance for Application No. 102301394 dated Nov. 8, 2013.
Taiwanese Notice of Allowance for Application No. 102301395 dated Nov. 8, 2013.
Restriction Requirement for U.S. Appl. No. 13/282,172 dated Nov. 26, 2013.
Notice of Allowance for U.S. Appl. No. 29/404,913 dated Nov. 27, 2013.
Taiwanese Notice of Allowance for Application No. 102301583 dated Dec. 17, 2013.
Taiwanese Notice of Allowance for Application No. 102301581 dated Dec. 17, 2013.
Taiwanese Notice of Allowance for Application No. 102301585 dated Dec. 17, 2013.

(56) References Cited

OTHER PUBLICATIONS

Notice of Allowance for U.S. Appl. No. 29/412,168 dated Dec. 20, 2013.
Non-Final Office Action for U.S. Appl. No. 29/425,831 dated Dec. 24, 2013.
Notice of Allowance for U.S. Appl. No. 29/412,166 dated Dec. 24, 2013.
Non-Final Office Action for U.S. Appl. No. 29/451,177 dated Dec. 30, 2013.
Notice of Allowance for U.S. Appl. No. 29/417,220 dated Jan. 10, 2014.
Restriction Requirement for U.S. Appl. No. 13/836,709 dated Jun. 19, 2014.
Non-Final Office Action for U.S. Appl. No. 14/052,201 dated Jun. 19, 2014.
Non-Final Office Action for U.S. Appl. No. 14,043,494 dated Jun. 20, 2014.
Non-Final Office Action for U.S. Appl. No. 14/148,102 dated Jun. 20, 2014.
Restriction Requirement for U.S. Appl. No. 14/168,561 dated Jul. 1, 2014.
Non-Final Office Action for U.S. Appl. No. 14/189,500 dated Jul. 15, 2014.
Korean Trail Decision for Application No. 30-2012-0020198 dated Jul. 29, 2014.
European Patent Office Communication pursuant to Rule 114(2) EPC for Application No. 2011-0843773 dated Aug. 20, 2014.
Japanese Office Action for Application No. 2012031548 dated Sep. 1, 2014.
Japanese Office Action for Application No. 2012031549 dated Sep. 1, 2014.
Notice of Allowance for U.S. Appl. No. 29/425,831 dated Sep. 4, 2014.
Final Office Action for U.S. Appl. No. 13/282,172 dated Sep. 17, 2014.

* cited by examiner

METHOD OF PROVIDING LIGHT EMITTING DEVICE

CROSS REFERENCE TO RELATED APPLICATIONS

This application relates and is a divisional of and claims priority to U.S. patent application Ser. No. 13/336,540, filed Dec. 23, 2011 which is a continuation-in-part of and claims priority to each of U.S. patent application Ser. No. 13/028,972, filed Feb. 16, 2011; and U.S. patent application Ser. No. 13/104,558, filed May 10, 2011. The disclosures of each of the related applications referenced herein are hereby incorporated by reference in their entireties.

TECHNICAL FIELD

The subject matter disclosed herein relates generally to light emitting devices and methods. More particularly, the subject matter disclosed herein relates to light emitting devices and methods having increased brightness via increased reflectivity, improved thermal performance, and improved adhesion within the device.

BACKGROUND

Light emitting devices, such as light emitting diodes (LEDs), may be utilized in packages for providing white light (e.g., perceived as being white or near-white), and are developing as replacements for incandescent, fluorescent, and metal halide high-intensity discharge (HID) light products. A representative example of an LED device comprises a device having at least one LED chip, a portion of which can be coated with a phosphor such as, for example, yttrium aluminum garnet (YAG). The phosphor coating can convert light emitted from one or more LED chips into white light. For example, LED chips can emit light having desired wavelengths, and phosphor can in turn emit yellow fluorescence with a peak wavelength of about 550 nm. A viewer perceives the mixture of light emissions as white light. As an alternative to phosphor converted white light, light emitting devices of red, green, and blue (RGB) wavelengths can be combined in one device or package to produce light that is perceived as white.

Despite availability of various LED devices and methods in the marketplace, a need remains for brighter devices. A need also remains for devices and methods which can advantageously improve optical and/or thermal performance by the addition of reflective layers within devices and/or improving adhesion between one or more layers within a submount of such devices.

SUMMARY

In accordance with this disclosure, novel light emitting devices and methods are provided that are well suited for a variety of applications, including industrial and commercial lighting products. It is, therefore, an object of the present disclosure herein to provide improved and brighter light emitting devices, in part by increasing reflectivity within the device. Another object of the present disclosure is to provide devices having improved adhesion between one or more layers of the device submount.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
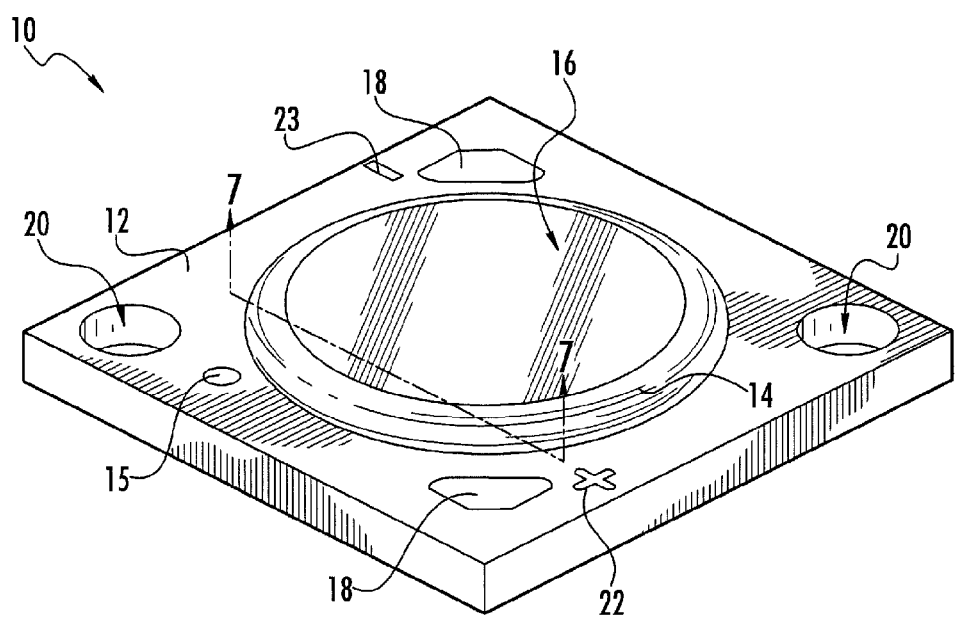
FIG. 1 is a top perspective view of an embodiment of a light emitting device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a growth substrate, for example, a silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may also be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein. For example, sapphire and gallium arsenide can be utilized as growth substrates for fabricating LEDs or lasers as described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds.

Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or substrate which may have different thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (with or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LEDS can be coated, at least partially, with one or more phosphors with the phosphors absorbing at least a portion of the LED light and emitting a different wavelength of light such that the LED emits a combination of light from the LED and the phosphor. In one embodiment, the LED emits a white light which is a combination of light emission from the LED chip and phosphor. One or more LEDs can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LEDs of different colors, one or more of which may be white emitting.

Figure 8:
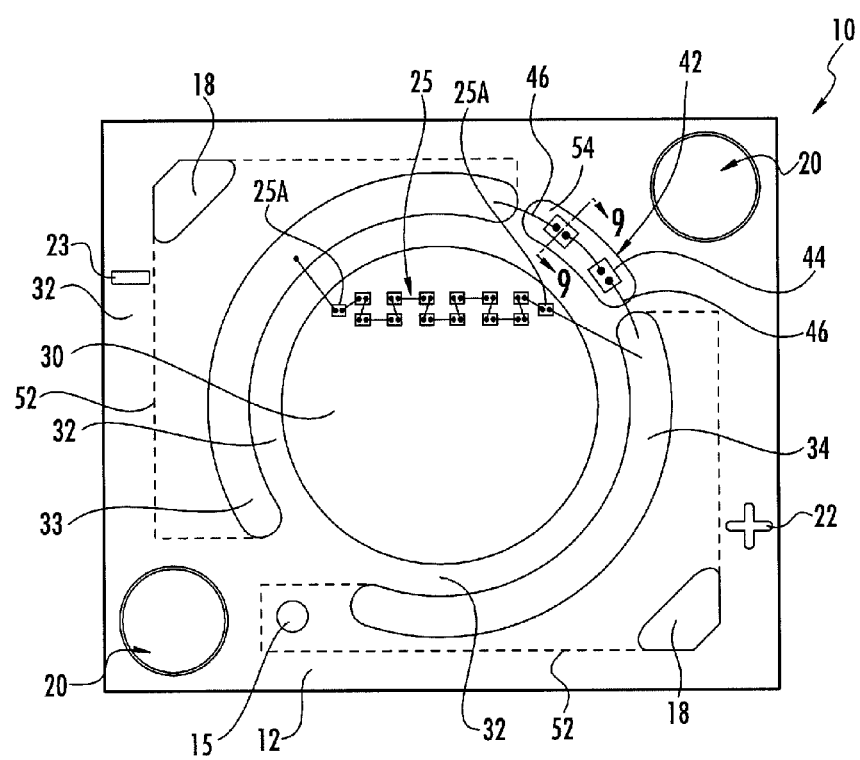
FIG. 8 is a top view of a light emitting device according to the disclosure herein.
Figure 9:
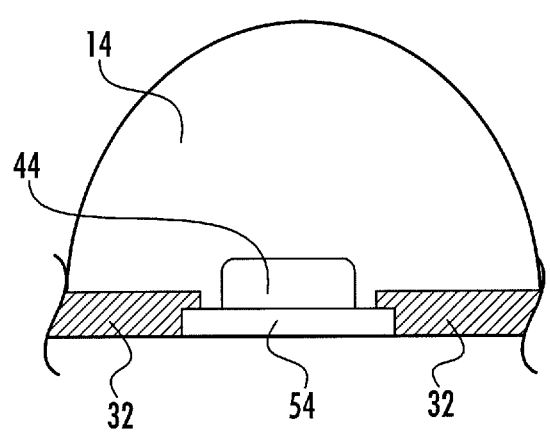
FIG. 9 is a cross-sectional view of a gap area of a light emitting device according to the disclosure herein.

Referring now to FIGS. 1 to 24, FIG. 1 illustrates a top view of a light emitting or LED device, generally designated 10. LED device 10 can comprise a submount 12 for supporting one or more LEDs. In one aspect, an emission area, generally designated 16, can be disposed over submount 12. In one aspect, emission area 16 can be disposed substantially centrally with respect to LED device 10. In the alternative, emission area 16 can be disposed in any location over LED device 10, for example, in a corner or adjacent an edge. In one aspect, emission area 16 can comprise a substantially circular shape. In other aspects, emission area 16 can comprise any other suitable shape, for example, a substantially square, oval, or rectangle shape. LED device 10 can comprise a single emission area 16 or more than one emission area 16. Notably, LED device 10 can comprise a uniform optical source in the form of emission area which can simplify the manufacturing process for manufacturers of light products requiring a single component. LED device 10 can further comprise a retention material 14 disposed at least partially about emission area 16 where retention material 14 can be referred to as a dam. Retention material 14 can also be disposed over at least one electrostatic discharge (ESD) protection device, such as a Zener diode 44 (FIG. 9). In some aspects, retention material can be disposed over two Zener diodes 44 connected in series between two electrical elements (FIG. 8).

Submount 12 can comprise any suitable mounting submount or substrate, for example, a printed circuit board (PCB), a metal core printed circuit board (MCPCB), an external circuit, or any other suitable submount or substrate over which lighting devices such as LEDs may mount and/or attach. Emission area 16 can be in electrical and/or thermal communication with submount 12. One or more intervening layers can be disposed between emission area 16 and submount 12 such that emission area 16 is indirectly disposed over submount 12 thereby indirectly electrically and/or thermally communicating with submount 12. In the alternative, emission area 16 can directly mount over submount 12 thereby directly electrically and/or thermally communicating, or connecting, with submount 12. In one aspect and for example only without limitation, submount 12 can comprise a compact dimension of 22 millimeter (mm)×22-mm square footprint. In other aspects, submount 12 can comprise any suitable dimension and/or shape, for example, a circular or rectangular shape.

Figure 7:
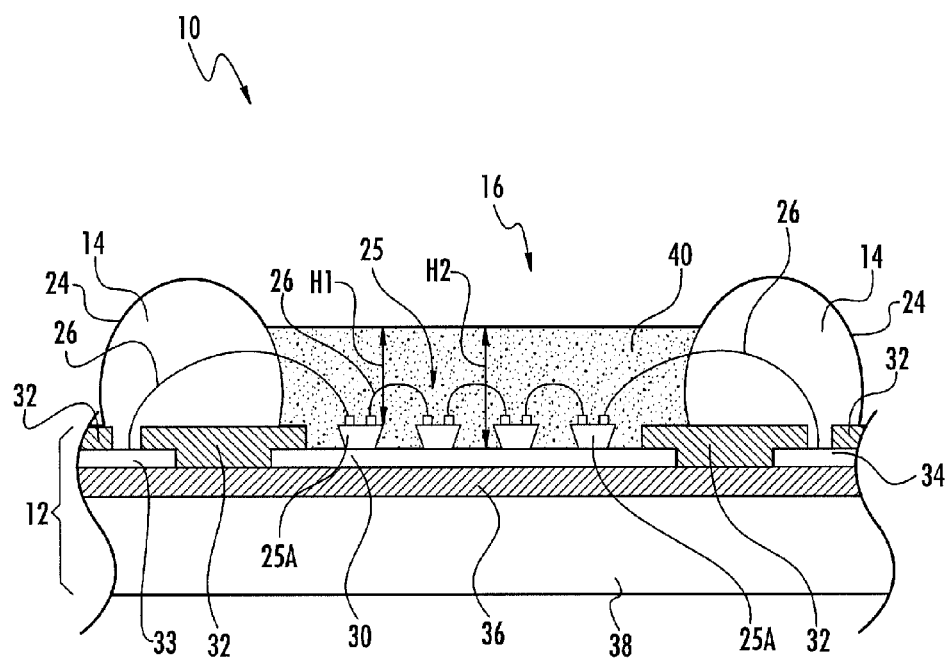
FIG. 7 is a second cross-sectional view of a light emission area of a light emitting device according to the disclosure herein.

Emission area 16 can comprise a plurality of LED chips, or LEDs 25 disposed within and/or below a filling material 40 such as illustrated in FIG. 7. LEDs 25 can comprise any suitable size and/or shape. For example, LEDs 25 can have a rectangle, square, or any other suitable shape. In one aspect, filling material 40 can comprise an encapsulant having a predetermined, or selective, amount of phosphors and/or lumiphors in an amount suitable for any desired light emission, for example, suitable for white light conversion. Filling material 40 can interact with light emitted from the plurality of LEDs 25 such that a perceived white light, or any suitable and/or desirable wavelength of light, can be observed. Any suitable combination of encapsulant and/or phosphors can be used, and combinations of different phosphors for resulting in desired light emission can be used. In other aspects, filling material 40 can comprise a molded lens material. Filling material 40 can be substantially opaque such that emission area 16 can be substantially opaque (as illustrated in FIG. 1), transparent, or semi-transparent depending upon, for example, the amount and type of phosphor used. Retention material 14 can be adapted for dispensing, or placing, about at least a portion of emission area 16. After placement of retention material 14, filling material 40 can be selectively filled to any suitable level within the space disposed between one or more inner walls of retention material 14. For example, filling material 40 can be filled to a level equal to the height of retention material 14 or to any level above or below retention material. The level of filling material 40 can be planar or curved in any suitable manner, such as concave or convex.

Still referring to FIG. 1, LED device 10 can also comprise at least one opening or hole, generally designated 20, that can be disposed through or at least partially through submount 12 for facilitating attachment of LED device 10 to an external substrate or surface. For example, one or more screws can be inserted through the at least one hole 20 for securing device 10 to another member, structure, or substrate. LED device 10 can also comprise one or more electrical attachment surfaces 18. In one aspect, attachment surfaces 18 comprise electrical contacts such as solder contacts. Attachment surfaces 18 can be any suitable configuration, size, shape and/or location and can comprise positive and negative electrode terminals through which an electrical current or signal can pass when connected to an external power source. One or more electrically conductive wires (not shown) can be attached and electrically connected to attachment surfaces 18 when welded, soldered, or any other suitable attachment method known. Electrical current or signal can pass into LED device 10 from the external wires electrically connected to the attachment surfaces 18 and into the emission area 16 to facilitate light output. Attachment surfaces 18 can electrically communicate with emission area 16 which comprises one or more LEDs 25. Attachment surfaces 18 can electrically communicate with first and second conductive traces 33 and 34 (see FIG. 8) and therefore LEDs 25 which may be electrically connected using electrical connectors. Electrical connectors can comprise wirebonds or other suitable members for electrically connecting LEDs 25 to first and second conductive traces 34 and 33.

LED device 10 can further comprise an indicator sign or symbol for denoting the electrical polarity for a given a side of LED device 10. For example, a first symbol 22 can comprise a "+" sign denoting the side of LED device 10 comprising the positive electrode terminal. A second symbol 23 can comprise a "−" sign denoting the side of LED device 10 comprising the negative electrode terminal. One or more test points 15 can be located adjacent either a positive or negative side of the device for testing the electrical and/or thermal properties of the LED device 10. In one aspect, test point 15 can be disposed adjacent the negative side, or terminal of LED device 10.

Figure 2:
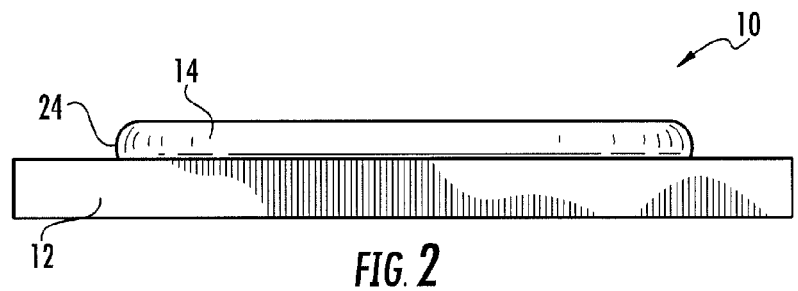
FIG. 2 is a side view of an embodiment of a light emitting device according to the disclosure herein.

FIG. 2 illustrates a side view of LED device 10. As illustrated by FIGS. 1 and 2, retention material 14 can comprise a substantially circular dam disposed about at least a portion of emission area 16 and disposed over submount 12. Retention material 14 can be dispensed, positioned or otherwise placed over submount 12 and can comprise any suitable size and/or shape. Retention material 14 can comprise any suitable reflective material and can comprise a clear or opaque white material such as, for example, a silicone or epoxy material. Filler particles such as titanium dioxide ($TiO_2$), for example, can be used and added to retention material 14 for providing an opaque material. Retention material 14 can be dispensed or deposited in place using an automated dispensing machine where any suitable size and/or shape of dam can be formed. In one aspect, a circular shape as shown can be dispensed, although any other configuration could also be provided such as, for example, a rectangular configuration, a curved configuration and/or any combination of desired configurations and cross-sectional shapes. As FIG. 2 illustrates in a side view of LED device 10, retention material 14 can comprise a rounded outer wall 24 such that the upper surface of retention material 14 opposite submount 12 is rounded. Rounding or curving outer wall 24 of retention material 14 may further improve the amount of light reflected by LED device 10.

Figure 3A:
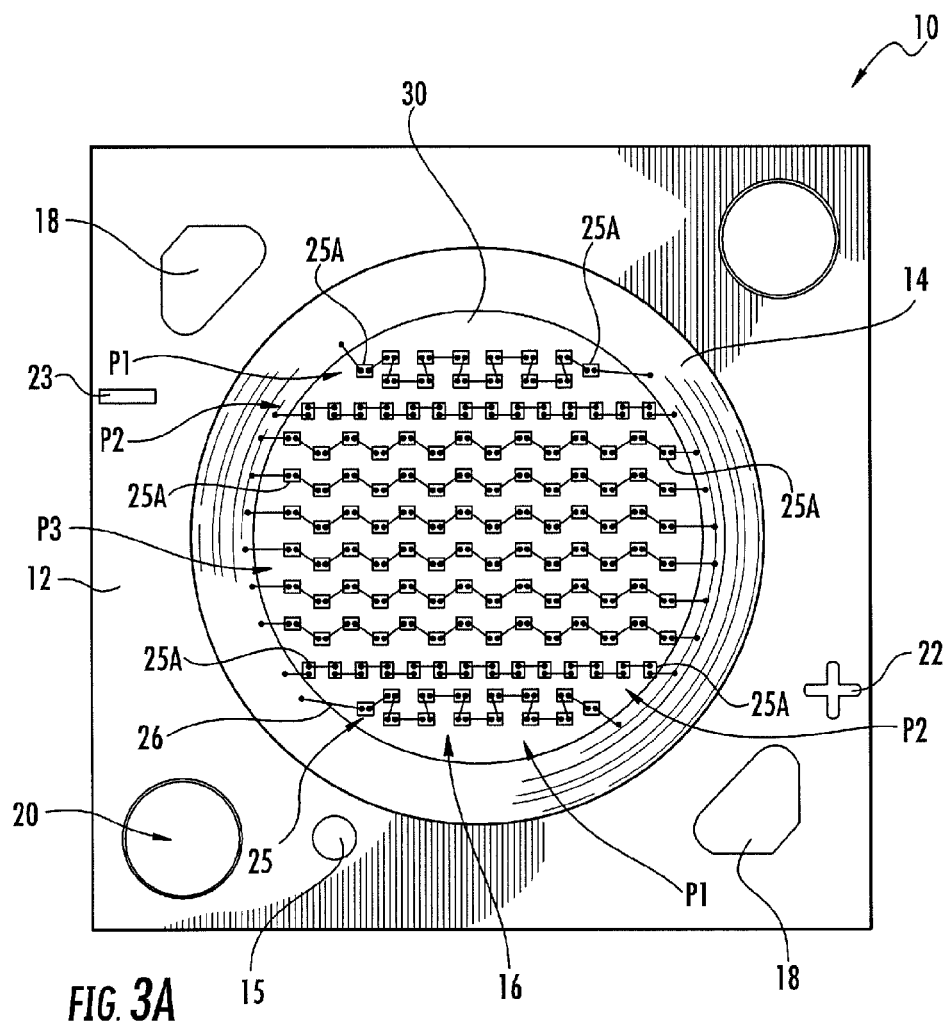
FIGS. 3A and 3B are top views of an embodiment of a light emitting device having one or more patterns of light emitting diodes (LEDs) according to the disclosure herein.
Figure 3B:
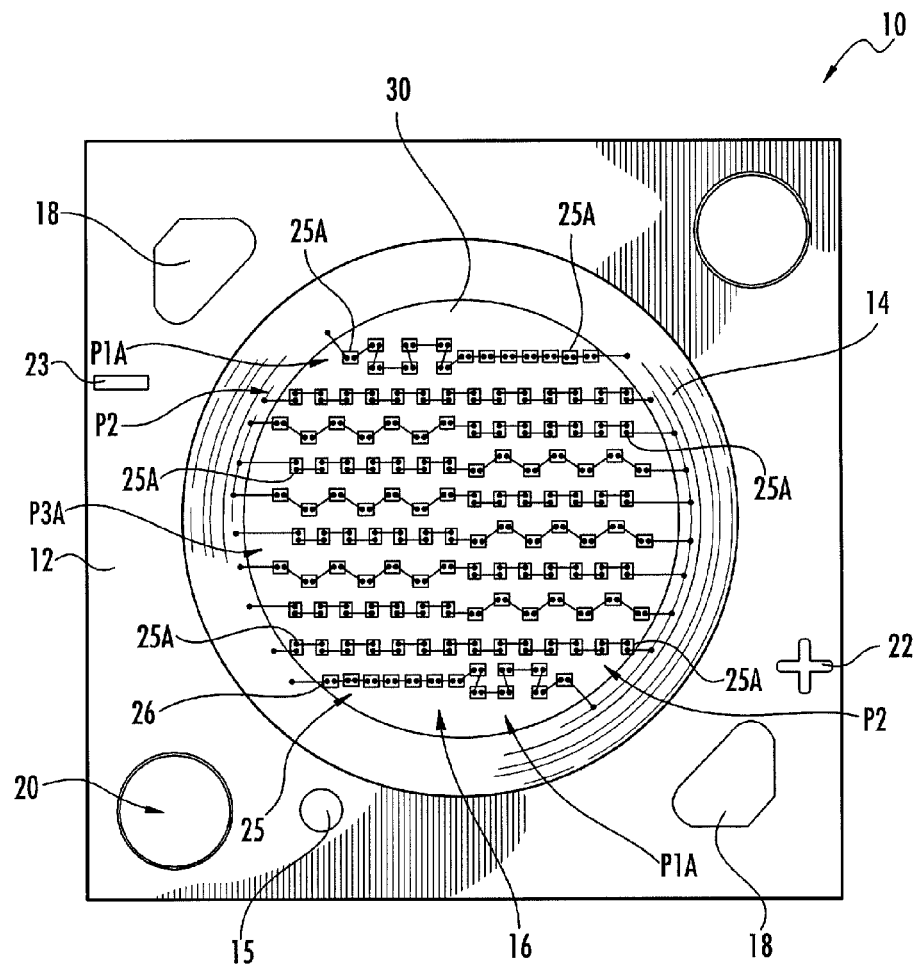

Retention material 14 can comprise any material known in the art, for example, a silicone material comprising 7% fumed silica+3% $TiO_2$+methyl silicone. In one aspect, retention material 14 is adapted to reflect light, and may comprise and/or be coated with a reflective material. As illustrated in FIGS. 3A and 3B, retention material 14 can be dispensed after wirebonding of the one or more LEDs 25 such that retention material 14 is disposed over and at least partially covers wirebonds 26 to contain at least a portion, such as one end of each of wirebonds 26 within retention material 14. In FIGS. 3A and 3B, wirebonds 26 for the first and last, or outermost edge LEDs 25A for a given set of LEDs such as LEDs 25 are disposed within retention material 14. In one aspect, retention material 14 can be "planed" during dispersion at room temperature for accurate volume and/or height control. The addition of $TiO_2$ can increase reflection about the emission area 16 to further to optimize light emission of LED device 10. Fumed silica can be added as a thixotropic agent. Dispersing retention material 14 can allow increased board space and the ability to withstand higher voltages. In some aspects, LED device 10 can be operable at 42 volts (V) or higher.

Figure 4:
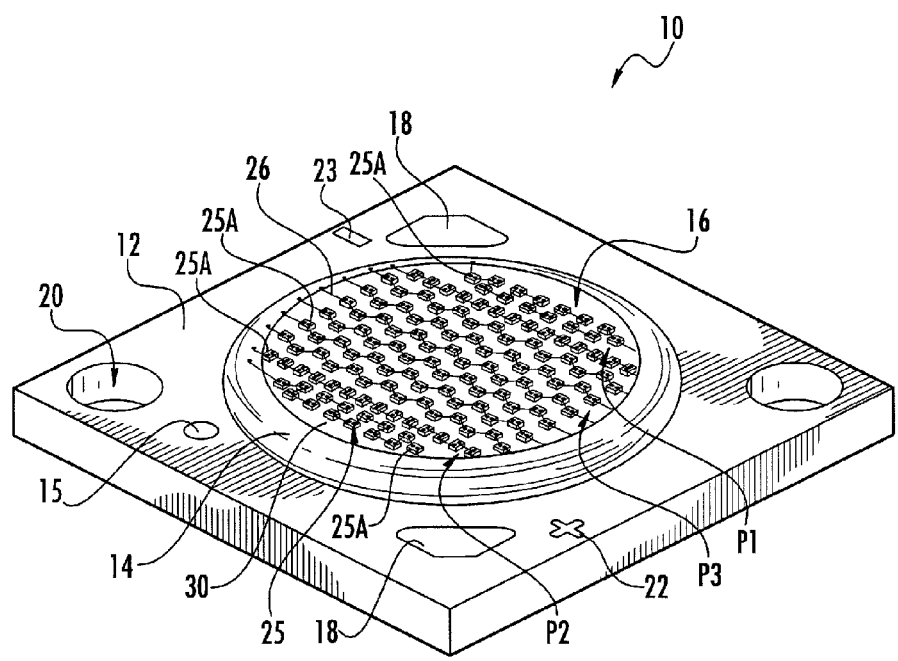
FIG. 4 is a top perspective view of an embodiment of a light emitting device having one or more patterns of LEDs according to the disclosure herein.

FIGS. 3A, 3B and 4 illustrate emission area 16 without a layer of filling material 40. FIGS. 3A and 3B illustrate LED device 10 and emission area 16 comprising at least one pattern, or arrangement, of LEDs. LEDs 25 can be arranged, disposed, or mounted over a conductive pad 30. LEDs 25 can be arranged or disposed in sets of LEDs, that can comprise one or more strings or LEDs, and a given set of LEDs can for example be one or more strings of LEDs electrically connected in series or any other suitable configuration. More than one set of LEDs can be provided, and each set of LEDs can be arranged in parallel to one or more other sets of LEDs. As described further herein, the LEDs in any given set or string of LEDs can be arranged in any suitable pattern or configuration, and even LEDs within a given set or string of LEDs can be arranged or disposed in one or more different patterns or configurations. For example, FIG. 3A illustrates at least three sets of LEDs arranged in three patterns, for example, a first pattern P1, a second pattern P2, and a third pattern P3. Each of patterns P1, P2, and P3 can comprise a consistent pattern design across emission area 16. More than one of patterns P1, P2, and/or P3 can be used. Each of patterns P1, P2, and/or P3 can alternate or be arranged in any suitable configuration. For illustration purposes, only three patterns are illustrated. Any number of patterns or arrangements is contemplated, and patterns can comprise any suitable design, for example, a checkerboard design or a grid design or arrangement wherein the LEDs can be at least substantially aligned in at least two directions. FIG. 3B illustrates at least three sets of LEDs arranged in patterns, for example, a first pattern P1A, second pattern P2, and a third pattern P3A which combine one or more of patterns P1, P2, and P3 illustrated in FIG. 3A. For example, patterns P1A and P3A can comprise a combination of more than one pattern. In one aspect, pattern P1A can comprise a grid arrangement or pattern and a straight line arrangement or pattern. In one aspect, pattern P3A can comprise the checkerboard and straight line pattern designs. Each of patterns P1A and P3A can comprise 14 LEDs 25, seven LEDs of each pattern design. For illustration purposes, only two combinations are illustrated. However, please note that each set of LEDs can comprise a combination of having more than two patterns.

Still referring to FIGS. 3A and 3B, conductive pad 30 can be electrically and/or thermally conductive and can comprise any suitable electrically and/or thermally conductive material. In one aspect, conductive pad 30 can comprise a conductive metal. In one aspect shown in FIG. 3A, emission area 16 can comprise one or more LEDs 25 arranged in a single pattern over conductive surface, or pad 30. In an alternative, LEDs can be provided that are a combination of more than one pattern of LEDs, such as LEDs 25, arranged over conductive pad 30 as FIG. 3B illustrates. As noted above, emission area 16 can comprise a combination of different arrangements or patterns, for example, a combination of first pattern P1, second pattern P2 and/or third pattern P3 for optimizing light emission and device brightness. Each set, or string of LEDs 25 disposed over conductive pad 30 can comprise outermost LEDs 25A with one or more LEDs 25 disposed therebetween. Each string of LEDs 25 can comprise the same or a different pattern, for example, patterns P1, P2, and/or P3. Strings of LEDs 25 can comprise diodes of the same and/or different colors, or wavelength bins, and different colors of phosphors can be used in the filling material 40 (FIG. 7) disposed over LEDS 25 that are the same or different colors in order to achieve emitted light of a desired wavelength. The one or more patterns of LEDs 25 can comprise an array of LEDs within emission area 16.

FIGS. 3A, 3B, and 4 illustrate emission area 16 comprising, for example, 10 lines, or strings, of LEDs 25. Each string of LEDs 25 can comprise any suitable number of LEDs electrically connected between outermost LEDs 25A which can connect to respective electrical elements. In one aspect, each string of LEDs 25 can comprise at least 14 LEDs. In one aspect, LED device can comprise at least 140 LEDs arranged in an array. The arrangements, patterns, and/or combination of multiple patterns herein can comprise an array for optimizing color uniformity and brightness of light emitted from LED device 10. The LEDs can be electrically connected in series using one or more wirebonds 26 for attaching bond pads of adjacent LEDs 25. In one aspect as shown in FIG. 3A, first pattern P1 can comprise the first and tenth strings of 14 LEDs 25. First pattern P1 can comprise two opposing lines of LEDs 25 disposed between the first and last, or outermost LEDs 25A of the series. In one aspect, first pattern P1 comprises what is referred to herein as a grid arrangement, pattern or design, where at least two LEDs are at least substantially aligned in at least two directions and can include single, unaligned LEDs at opposing ends of a set or string of LEDs. Each of the LEDs 25 comprising first pattern P1 can be electrically connected in series. In one aspect, second arrangement or second pattern P2 can be disposed adjacent first pattern P1, for example, located at the second and ninth strings of LEDs 25. In one aspect, second pattern P2 can comprise 14 total LEDs 25 wherein each of the 14 LEDs 25 can be arranged adjacent each other along a horizontal line in a straight line design, or arrangement, and each of the 14 LEDs 25 can be electrically connected in series. Any suitable number of LEDs 25 can be connected in any suitable configuration or arrangement such as in series to form a string having a suitable pattern. When connecting in series, care must be taken when connecting LEDs 25 in series such that the positive or negative electrode of a preceding LED electrically connects to an electrode of opposite electrical polarity for a subsequent LED for allowing electrical current to flow properly through the string of LEDs 25.

Third pattern P3 shown in FIG. 3A can comprise a checkerboard pattern having a checkerboard design, or arrangement of LEDs 25 electrically connected in series. In one aspect, at least 14 LEDs 25 can comprise the checkerboard pattern, and third pattern P3 can be disposed between and/or alternate with strings of LEDs having second pattern P2. The checkerboard pattern or third pattern P3 can comprise a set of LEDs 25 alternating both above and below a horizontal line. Patterns P1, P2, and P3 are not limited in the shape of pattern or to at least 14 LEDs, but rather, patterns can comprise any suitable arrangement and any suitable number of LEDs 25. For illustration purposes, only three patterns are shown although any suitable number of patterns could be utilized. The alternating LEDs 25 of third pattern P3 can optimize light output by ensuring uniform coverage and spatial alignment over conductive pad 30 such that light emission is uniform and improved. Third pattern P3 can repeat from the third through the eighth string of LEDs 25. First and last LEDs 25A in a given string of LEDs 25 for each of patterns P1, P2, and/or P3 can electrically connect to first and second conductive traces 33 and 34 (see FIGS. 7, 8) for receiving and transmitting electrical current or signal through and illuminating a given string of LEDs 25.

The LEDs even in a single set or string in emission area 16 can comprise LEDs in more than one pattern or configuration. For example, FIG. 3B illustrates one aspect of a possible arrangement of LEDs in emission area 16 where there are at least two sets, shown here as strings without limitation, of LEDs 25 and where LEDs 25 for some sets or strings are arranged in different patterns or configurations with respect to another set or string of LEDs and even within one single set or string of LEDs. Any two given separate sets or strings of LEDs 25 can be electrically connected in a pattern such that some or all of the LEDs within each of the two sets or strings of LEDs can be arranged in different patterns, in identical patterns, or in any combination of patterns. In other words, the LEDs in any given set or string can be disposed in different or identical patterns with respect not only to the LEDs in that set or string but can also be disposed in any pattern with respect to another set or string of LEDs and the two sets or strings can in one aspect be parallel to one another. For example, LEDs 25 in FIG. 3B can be disposed in one aspect such that emission area 16 comprises a combination of different arrangements or patterns, for example, a first pattern P1A, a second pattern P2A and/or a third pattern P3A for optimizing light emission and device brightness.

As noted earlier, patterns P1A and P3A illustrate a combination of two different patterns, for example at least two of the checkerboard, straight line and/or grid arrangement, however, combinations of more than two patterns is hereby contemplated. Only three pattern arrangements have been disclosed (i.e., checkerboard, grid, straight line), but any suitable arrangement or pattern design can be used. Each string of LEDs 25 disposed over conductive pad 30 can comprise outermost LEDs 25A with one or more LEDs 25 disposed therebetween. Each set or string of LEDs 25 can comprise the same or a different pattern, for example, patterns P1A, P2A, and/or P3A. Sets or strings of LEDs 25 can comprise diodes of the same and/or different colors, or wavelength bins, and different colors of phosphors can be used in the filling material 40 (FIG. 7) disposed over LEDs 25 that are the same or different colors in order to achieve emitted light of a desired wavelength. The one or more patterns of LEDs 25 can comprise an array of LEDs within emission area 16. As FIG. 3B illustrates, for example, in pattern P3A, sets of LEDs 25 can comprise rectangular LEDs arranged where the major (i.e., long) axis of a first LED is disposed in a different orientation than the major axis of at least a second LED. That is, a given set of LEDs 25 can comprise LEDs 25 in different orientations. In other aspects, as illustrated in FIG. 3A for example, pattern P2 and pattern P3 can comprise sets of rectangular LEDs 25 where the major axis is the same is the same for the given set but different from the orientation of other sets.

The various LED arrangements and device designs as described herein are advantageous for providing a light emitting device with excellent performance and output while still being a small light emitting device where pressure exists to provide small devices while maintaining quality performance and light output.

Figure 5:
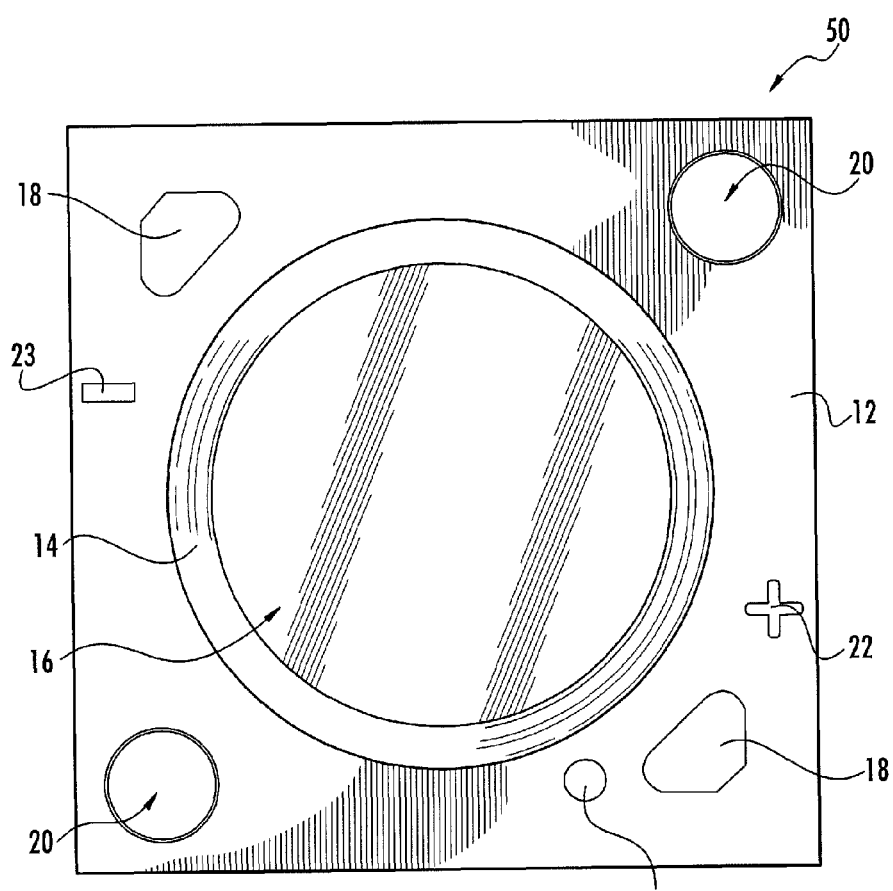
FIG. 5 is a top view of an embodiment of a light emitting device according to the disclosure herein.

FIG. 5 illustrates a second embodiment of an LED device, generally designated 50 which is similar in form and function to LED device 10. LED device 50 can comprise submount 12 and emission area 16 disposed over submount 12. Emission area 16 can comprise any suitable size, shape, number and/or be disposed at any suitable location over submount 12. Retention material 14 can be disposed over submount 12 and at least partially about emission area 16. LED device 50 can comprise one or more openings or holes 20, disposed through submount 12 for facilitating attachment of LED device 10 to an external substrate or surface. LED device 50 can comprise first and second symbols 22 and 23 for denoting the electrical polarity of LED device 50. LED device 50 illustrates test point 15 disposed adjacent the positive or side of the device for testing the electrical and/or thermal properties of the LED device 50. LED device 50 further can comprise at least one electrical attachment surface 18 that can electrically connect to one or more external wires (not shown) for facilitating the flow of electric current into emission area 16 of LED device 50. In one aspect, attachment surface 18 can comprise a shape having curved corners. Rounding the corners, or edges of attachment surfaces 18 may better contain the flow of solder over the device than sharp corners when attaching one or more external conductive wires (not shown) to LED device 50.

Figure 6:
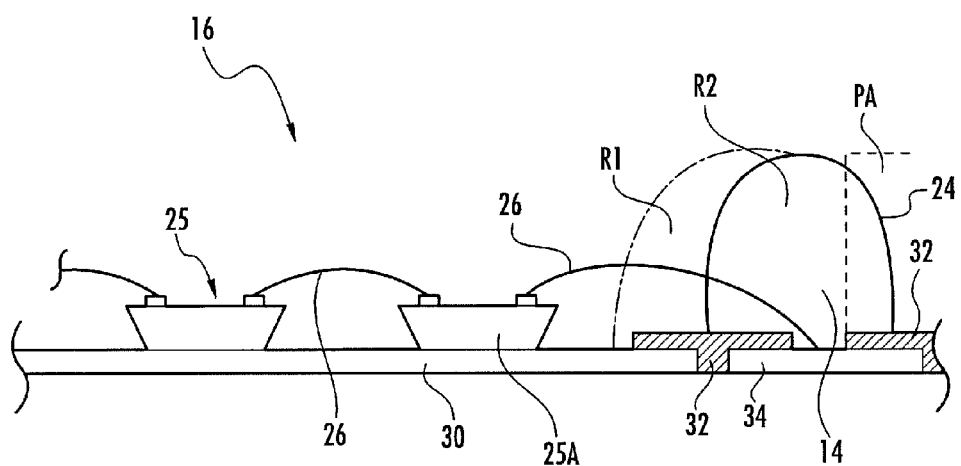
FIG. 6 is a first cross-sectional view of a light emission area of a light emitting device according to the disclosure herein.

FIG. 6 illustrates a portion of a cross-section along an edge of conductive pad 30 of FIGS. 3A and 3B wherein the emission area 16 has not been filled with filling material 40 such as encapsulant and/or phosphors. FIG. 6 illustrates LEDs 25 comprising an outermost LED 25A and adjacent LED for a given string of LEDs within emission area 16. FIG. 7 illustrates a portion of a cross-section of FIG. 1 wherein filling material 40 is disposed over emission area 16. For illustration purposes, four LEDs 25 are illustrated and electrically connected in series in FIG. 7. However, as noted earlier, each string, or pattern of LEDs 25 can comprise any suitable number of LEDs 25. In one aspect, each string of LEDs can comprise 14 LEDs 25. FIGS. 6 and 7 illustrate one or more LEDs 25 connected in series by one or more wirebonds 26. LEDs 25 can be arranged over conductive pad 30 and can thermally communicate directly with conductive pad 30 or indirectly through one or more intervening layers. LEDs 25 can attach to conductive pad 30 or intervening layers using any attachment means known in art. In one aspect, LEDs 25 can attach using solder pastes, epoxies, or flux. Conductive pad 30 can be formed integral as one piece of submount 12 or can comprise a separate layer disposed over submount 12. Conductive pad 30 can dissipate heat generated by the one or more LEDs 25.

As FIGS. 6 and 7 further illustrate, the outermost LEDs 25A for a series, string, or pattern of LEDs 25 can electrically communicate or connect to one or more electrical elements. Electrical elements can comprise first and second conductive traces 33 and 34 configured to flow, or supply electrical signal or current to the respective strings of LEDs 25. One of first and second conductive traces 33 and 34 can comprise an anode and the other a cathode. The electrical polarity can be denoted by first and second symbols 22 and 23 (FIG. 1) as discussed earlier. Conductive pad 30 and conductive traces 33 and 34 can comprise any suitable electrical and thermally conductive materials and can comprise either the same or different materials. In one aspect, conductive pad 30 and conductive traces can comprise a layer of copper (Cu) deposited over a portion of submount (e.g., dielectric layer 36 of FIG. 7) using any suitable technique. An electrically insulating solder mask 32 can be disposed at least partially between conductive pad 30 and respective conductive traces 33 and 34 such that when solder is used to attach one or more LEDs 25 over conductive pad 30, the solder cannot electrically connect with the conductive traces 33 and 34 thereby causing one or more strings of LEDs 25 to become electrically shorted.

FIG. 6 illustrates various placement areas, positions, or locations of retention material 14 about emission area 16. In one aspect, retention material 14 can be dispensed about at least a portion, or entirely about emission area 16. Conventional devices can comprise a molded as opposed to dispensed dam placed at a location such as prior art location PA shown in broken lines in FIG. 6 and disposed along an edge of where solder mask 32 contacts first conductive trace 34. The present subject matter envisions retention material 14 disposed in areas, positions, or locations R1, R2, and/or any location therebetween. When retention material 14 is disposed in locations R1 or R2, it can be disposed over and cover at least a portion of one or more wirebonds 26 connecting outermost LEDs 25A to electrical elements, such as conductive trace 34. When in location R1, retention material 14 can be disposed at least partially over each of solder mask 32 and wirebond 26 connected to outermost LED 25A for a respective string of LEDs 25. In one aspect, retention material 14 can be disposed entirely over the portion of solder mask 32 disposed between conductive pad 30 and conductive trace 34 and/or entirely over wirebond 26 when in location R1. In another aspect, retention material 14 can be disposed over and at least partially or entirely cover each of the wirebonds 26 of each of the outermost LEDs 25A for each string of LEDs 25 disposed in emission area 16. The retention material can be dispensed in a predetermined location on the submount 12 for providing a suitable distance between the retention material 14 and the one or more LEDs 25. Notably, when in location R1, retention material 14 can eliminate the need for solder mask 32 as retention material would be disposed between conductive pad 30 and first and/or second conductive traces 33, 34. Location R2 illustrates retention material 14 disposed at least partially over solder mask 32 and at least partially over wirebond 26 of outermost LED 25A. As illustrated, retention material 14 according to the subject matter herein can comprise a substantially rounded or hemispheric shaped cross-section. Rounding retention material 14 can increase the surface area from which light may be emitted and/or reflected.

FIG. 7 illustrates a string of one or more LEDs 25, for illustration purposes four LEDs 25 are shown but strings of LEDs 25 can comprise any suitable number of LEDs, for example, 14 LEDs 25 arranged in series. FIG. 7 illustrates a cross-section of submount 12 over which LEDs 25 can be mounted or otherwise arranged. Submount 12 can comprise, for example, conductive pad 30, first and second conductive traces 33 and 34, and solder mask 32 at least partially disposed between conductive pad 30 and each of conductive traces 33 and/or 34. As noted earlier, if retention material is positioned adjacent outermost LEDs 25A, for example in location R1, solder mask 32 between conductive pad 30 and first and second conductive traces 33 and 34 can be eliminated as it would no longer be necessary. Solder mask 32 can be disposed between conductive traces 33 and 34 and attachment surfaces 18 (FIG. 8), the proximal edges of which can be seen in FIG. 7 adjacent retention material 14, adjacent the outer wall 24 of retention material 14. Submount 12 can further comprise a dielectric layer 36, and a core layer 38. For illustration purposes, submount 12 can comprise a MCPCB, for example, those available and manufactured by The Bergquist Company of Chanhassan, Minn. Any suitable submount 12 can be used, however. Core layer 38 can comprise a conductive metal layer, for example Cu or aluminum (Al). Dielectric layer 36 can comprise an electrically insulating but thermally conductive material to assist with heat dissipation through submount 12. FIG. 7 illustrates retention material 14 arranged, for example, in position R2 at least partially over each of solder mask 32 and the wirebond 26 connecting to conductive traces 33 and 34. FIG. 7 illustrates filling material 40 disposed over the one or more LEDs 25. Filling material 40 can be selectively filled to any suitable level higher, lower, or equal to the height of retention material 14. Wirebonds 26 of the outermost LEDs 25A as shown can be at least partially disposed within retention material 14.

FIG. 7 further illustrates examples of first and second heights H1 and H2 of filling material 40 which can be selectively filled within LED device 10. First height H1 can comprise a height at which filling material 40 is disposed over the LEDs 25. The height may vary due to process variability, so an average height above the string of LEDs 25 can be used and controlled for optimal brightness. Second height H2 can comprise a height at which filling material 40 is selectively disposed over a top surface of conductive pad 30. Second height H2 can be controlled, for example, by controlling the location of retention material 14 and whether it assumes location R1, R2 or any position therebetween. Second height H2 can also be controlled by controlling the amount of filling material 40 dispensed into the cavity defined by retention material 14.

Controlling the volume of filling material 40 within the cavity, or dam defined by retention material 14 can affect first and second heights H1 and/or H2 and can notably allow for fine-tuning or micro-tuning the color, or wavelength, of light emitted from LED device 10. Micro-tuning the color of LED devices 10 can therefore ideally increase product yields to 100%. For example, the amount of color affecting components, including but not limited to phosphors, contained in filling material 40 can be selectively added and the first and/or second heights H1, H2 can be selectively controlled by under or over filling the filling material 40 within emission area 16 depending on the wavelength of LEDs 25 used within device 10. Location of retention material 14, for example, locating retention material at R1, R2, or any position or distance therebetween can also affect first and/or second heights H1 and H2. Micro-tuning color can be achieved over multiple devices or on a per device, or package, basis by changing, for example the ratio of volume of phosphor to overall dispense capability volume of filling material 40. The ratio of volume of phosphor to overall dispense capability volume of filling material 40 can be adjusted based on the wavelength bin of LEDs 25 selected for use in a given device to attain the desired overall wavelength output of LED device 10. By manipulating, for example, the diameter of the dam provided by retention material 14 and/or the height of retention material 14, each of which can affect heights H1 and/or H2 and therefore the volume of fill material, the color of individual devices 10 can be micro-tuned thereby attaining higher process yields. Notably, selectively controlling a volume of the fill material such that color-affecting components of the fill material can be fine-tuned allows for light produced by the one or more LEDs to fall within a predetermined and precise color range.

FIG. 8 illustrates LED device 10 comprising submount 12 prior to arranging, dispensing, or otherwise placing retention material 14 about at least a portion of emission area 16. For illustration purposes, only a first string of LEDs 25 is illustrated, however, as noted earlier, emission area can comprise more than one strings of LEDs 25 electrically connected in series. In one aspect, LED device 10 comprises 10 strings of LEDs 25 connected in series. As illustrated, prior to placing retention material 14, submount 12 can comprise first and second conductive traces 33 and 34 arranged in a substantially circular arrangement about conductive pad 30 such that LEDs arranged over conductive pad 30 can electrically communicate to each trace by wirebonding and wirebonds 26 or by any other suitable attachment method. As illustrated, outermost LEDs 25A for a respective string of LEDs 25 can electrically connect to conductive traces.

At least one gap 42 can exist between conductive traces 33 and 34. LED device 10 and devices disclosed herein can further comprise elements to protect against damage from ESD positioned, or disposed in the gap 42. In one aspect, different elements can be used such as various vertical silicon (Si) Zener diodes, different LEDs arranged reverse biased to LEDs 25, surface mount varistors and lateral Si diodes. In one aspect, at least one Zener diode 44 can be disposed between ends of first and second conductive traces 33 and 34 and reversed biased with respect to the strings of LEDs 25. In one aspect, zener diode 44 can be disposed over an electrically and/or thermally conductive surface or area 54 such that current can flow through the diode 44, into the wirebonds 46, and to respective conductive traces 33 and 34. In further aspects, two Zener diodes 44 can be electrically connected in series using one or more wirebonds 46 between first and second conductive traces 33 and 34 for higher voltage applications. As Zener diodes 44 are typically black and absorb light, placing the at least one Zener diode 44 in gap 42 between conductive traces 33 and 34 and also beneath retention material 14 can further improve light output intensity.

FIG. 8 also illustrates one possible location for conductive pad 30. That is, conductive pad 30 can comprise a substantially centrally located circular pad disposed between conductive traces 33 and 34. Conductive pad 30 however, can be located at any suitable location over submount and any location other than substantially center the device. Solder mask 32 can be disposed at least partially between respective conductive traces and conductive pad 30, such that the solder mask 32 comprises a substantially circular arrangement about conductive pad 30. Solder mask 32 can also be disposed in areas outside of the conductive traces, for example, between the respective conductive traces and one or more attachment surfaces 18. Broken lines 52 illustrate one possible aspect of the size and/or shape of the electrically and/or thermally conductive material comprising the conductive traces 33 and 34. The lines are broken to illustrate how the material can be disposed under solder mask 32. Thus, attachment surfaces 18 electrically and/or thermally communicate with respective conductive traces, and can comprise the same layer of material. External, conductive wires (not shown) can electrically connect to attachment surfaces 18, and electrical current or signal can flow from the attachment surfaces 18 to the respective conductive traces. The electrical current can flow along the conductive material designated by dotted lines 52 disposed below the layer of solder mask 32. The electrical current can flow into and/or out of the conductive traces and therefore into and out of respective strings of LEDs 25 mounted over conductive pad 30. Test point 15 can also comprise conductive material and be disposed within the conductive area as indicated by broken lines 52. Test point 15 can be disposed either to the left of trace 34 as illustrated or between trace 34 and attachment surface 18 as illustrated in FIG. 10.

As noted earlier, Zener diodes 44 are typically black and absorb light. FIG. 9 illustrates Zener diode 44 upon placement of the retention material. In one aspect, retention material 14 can be disposed at least partially over the at least one Zener diode 44. In another aspect, retention material 14 can be disposed entirely over the at least one Zener diode 44 such that the diode is completely covered for further improving light output intensity. Zener diode 44 can be disposed over an electrically and/or thermally conductive surface or area 54 such that current can flow through the diode 44, into the wirebonds 46, and to respective conductive traces 33 and 34.

LED devices disclosed herein can advantageously consume less energy while delivering equal or greater illumination. In one aspect, when used in traditional downlight applications, luminaires based on LED devices 10 and/or 50 can deliver 38% more illumination than a 26-watt CFL or a 100-watt incandescent bulb, while consuming only 14 watts. In one aspect, LED device 10 can enable a 60-watt A-lamp equivalent while consuming only 11 watts. LED device 10 can comprise a light output of 1050 lumens at 11 watts, or 2000 lumens at 27 watts, with a 3000-K warm-white color temperature.

Figure 10:
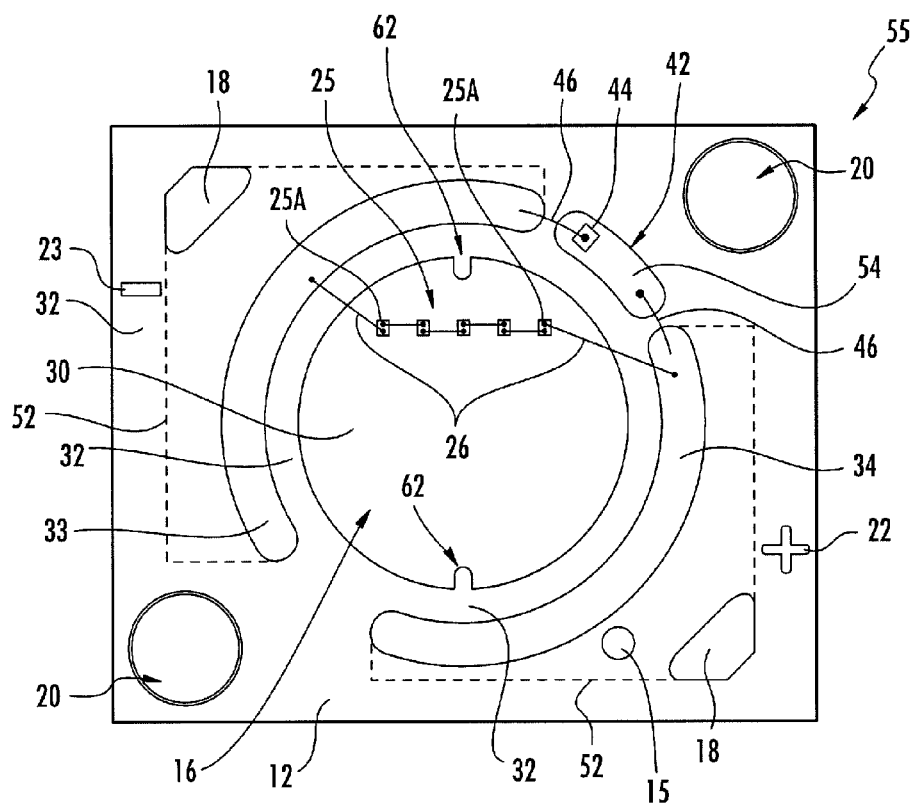
FIG. 10 is a top view of a light emitting device according to the disclosure herein.

FIG. 10 illustrates another embodiment of an LED device, generally designated 55. LED device 55 illustrates submount 12 prior to arranging, dispensing, or otherwise placing retention material 14 (FIG. 11) about at least a portion of emission area 16. For illustration purposes, only a first string of LEDs 25 is illustrated, however, emission area can comprise more than one string of LEDs 25 electrically connected in series. Each string of LEDs 25 can comprise the same or a different pattern. Prior to placing retention material 14, submount 12 can comprise first and second conductive traces 33 and 34 arranged in a substantially circular arrangement about conductive pad 30 such that LEDs arranged over conductive pad 30 can electrically communicate to each trace by wirebonding via wirebonds 26 or any other suitable attachment method. As illustrated, outermost LEDs 25A for a respective string of LEDs 25 can electrically connect to the conductive traces. In fact, for LED devices described herein, emission area 16 can comprise a single, undivided mounting area at least partially defined by outermost LEDs 25A, with the outermost LEDs 25A being wirebonded via wirebonds 26 to contact areas, such as conductive traces 33 and 34. LEDs 25 that are not the outermost LEDs 25A are wirebonded via wirebonds 26 in strings having one or more patterns or arrays.

At least one gap 42 can exist between conductive traces 33 and 34. In this embodiment, one or more ESD protection device or Zener diode 44 can be disposed in gap 42 and can be electrically connected, or mounted to conductive area 54. In this embodiment, Zener diode 44 can comprise one top and bottom electrical contact (e.g., vertical build) as opposed to LEDs 25 having two top electrical contacts (e.g., horizontal build). In this embodiment, conductive area 54 can comprise an area larger than a footprint of Zener diode 44. Zener diode 44 can be positioned over conductive area 54 between ends of first and second conductive traces 33 and 34. Zener diode 44 can be reversed biased with respect to the one or more strings of LEDs 25. For example, when one Zener diode 44 is used, one or more wirebonds 46 can connect conductive area 54 to one of first and second conductive traces 33 and 34 such that Zener diode 44 can be reverse biased with respect to the strings of LEDs 25. As Zener diodes 44 are typically black and absorb light, placing the at least one Zener diode 44 in gap 42 between conductive traces 33 and 34 and also beneath retention material 14 (FIG. 9) can further improve light output intensity.

FIG. 10 also illustrates one possible location for test point 15. Test point 15 can be disposed within the area marked by broken lines 52 which correspond to conductive material disposed under solder mask. Broken lines 52 illustrate one possible aspect of the size and/or shape of the conductive material which can be deposited on or in submount 12 for electrically coupling conductive traces 33 and 34 and attachment surfaces 18. The electrical coupling allows electrical current to be communicated from attachment surfaces 18 to the one or more strings of LEDs 25 electrically connected to traces 33 and 34. The lines are broken to illustrate how the material can be disposed under solder mask 32. Thus, test point 15 and attachment surfaces 18 electrically and/or thermally communicate with respective conductive traces, and can comprise the same layer of material. Solder mask 32 can be deposited or disposed at least partially between respective conductive traces and conductive pad 30, such that the solder mask 32 comprises a substantially circular arrangement about conductive pad 30. Conductive pad 30 can comprise one or more marks or notches 62 for orientation purposes and for proper alignment of retention material 14.

Solder mask 32 can also be deposited in areas outside of the conductive traces, for example, between the respective conductive traces and one or more attachment surfaces 18 and/or test point 15. External, conductive wires (not shown) can electrically connect to attachment surfaces 18, and electrical current or signal can flow from the attachment surfaces 18 to the respective conductive traces. The electrical current can flow along the conductive material designated by dotted lines 52 disposed below the layer of solder mask 32. The electrical current can flow into and/or out of the conductive traces and therefore into and out of respective strings of LEDs 25 mounted over conductive pad 30. In one aspect, test point 15 can allow thermal properties of the device to be tested when probed with a suitable temperature sensor (not shown). The arrangement illustrated by FIG. 10, i.e., the location of conductive traces 33 and 34, conductive area 54, Zener diode 44, and test point 15 prior to placing retention material 14 can correspond to any one of the previously described LED devices e.g., 10 and 50 or any of the devices described in FIGS. 11-14. For example, LED devices described in FIG. 11-14 can comprise at least one opening or hole, generally designated 20, that can be disposed through or at least partially through submount 12 for facilitating attachment of the LED devices to an external substrate or surface. In addition first symbol 22 and second symbols can be used to denote the portions of the LED devices comprising positive and negative electrode terminals. One or more test points 15 can be located adjacent either a positive or negative side of the device for testing the electrical and/or thermal properties of the LED devices.

Figure 11:
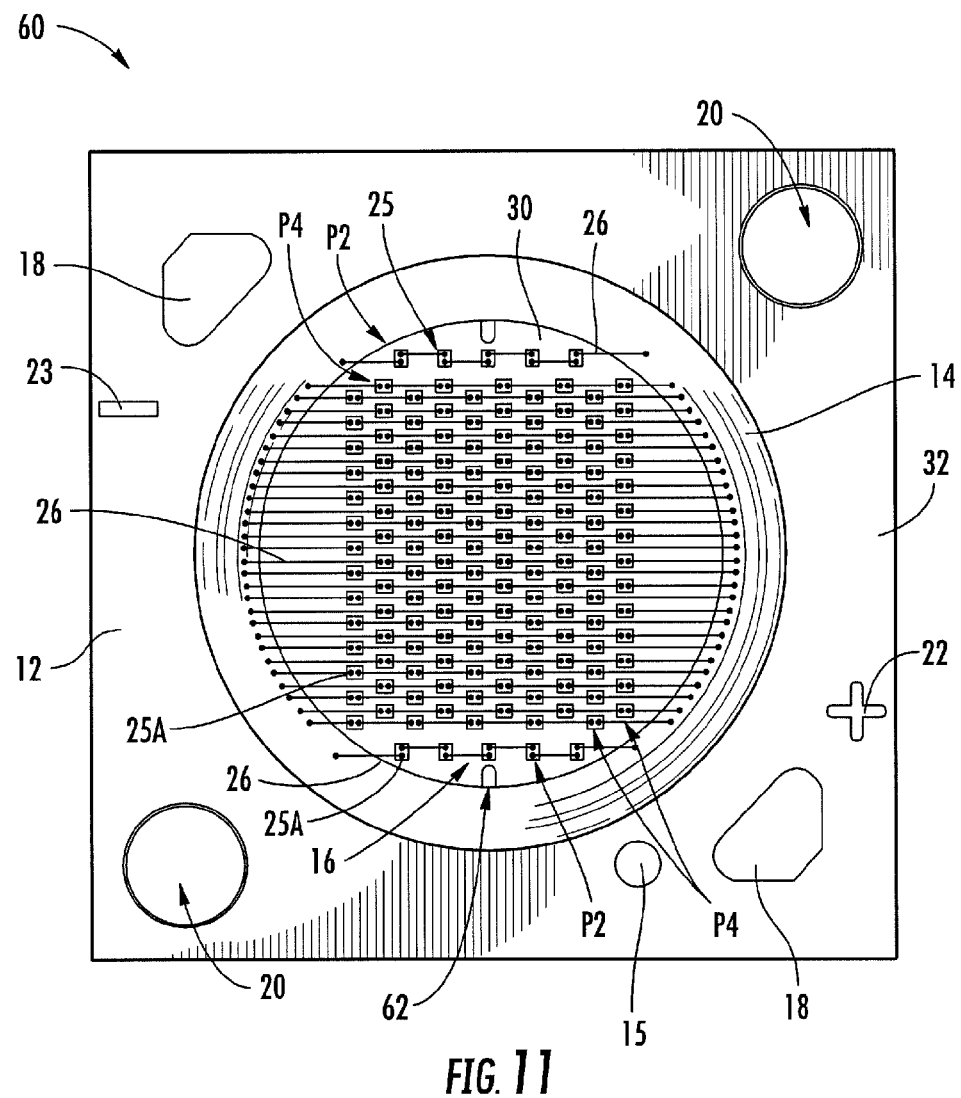
FIGS. 11 to 14B are top views of embodiments of a light emitting device having one or more patterns of LEDs according to the disclosure herein.

FIGS. 11 to 14 illustrate top views of different embodiments of LED devices. Such devices may be similar in many aspects to previously described LED devices 10 and 50, but can also be useful for a range of low and/or high voltage applications in addition to attaining different light output by pattern variation. For example, FIG. 11 illustrates one embodiment of an LED device, generally designated 60 which can be used in lower voltage applications. In one aspect and for example only without limitation, LED device 60 can be operable at approximately 16 V. In one aspect, LED device 60 can be operable at less than approximately 16 V, for example, 14 to 16 V. In one aspect, LED device 60 can be operable at more than approximately 16 V, for example, 16 to 18 V. In one aspect, using more than 140 LEDs 25, e.g., more than LED device 10 and changing the pattern of LEDs 25 can allow LED device 60 to be operable at lower voltage applications. In one aspect, the pattern can be changed by electrically connecting less than 14 LEDs 25 together in a series or string.

FIG. 11 illustrates at least two sets of LEDs arranged in two patterns forming a reticulated array of LEDs 25 within emission area 16. For example, a first set of LEDs can comprise second pattern P2, previously described. A second set of LEDs can comprise a fourth pattern P4. Each pattern can comprise, for example, 30 strings of five LEDs 25 electrically connected in series. That is, fewer than 14 (FIGS. 3A, 3B) LEDs 25 can be electrically connected in series in a given string. The first and last strings of LEDs 25 can comprise five LEDs 25 electrically connected in series according to previously described second pattern P2. The second to twenty-ninth strings can comprise another pattern different from the first and thirtieth strings. For example, FIG. 11 illustrates five LEDs 25 electrically connected in series according to pattern P2, the strings can be disposed on conductive pad 30 proximate one or more rounded outer edges of emission area 16. LEDs 25 arranged in the first and thirtieth strings can, for example and without limitation, be spaced equidistant from each other and uniformly across emission area 16 according to pattern P2. LEDs 25 arranged in pattern P2 can comprise a straight line arrangement in which longer axes of LEDs 25 are substantially parallel. The shorter axes of LEDs 25 in pattern P2 can also be at least substantially parallel. Longer axes of LEDs 25 arranged in pattern P2 can be aligned perpendicular to wirebonds 26. In addition, longer axes of LEDs 25 arranged in pattern P2 can be perpendicular to longer axes of LEDs 25 arranged in adjacent patterns, e.g., pattern P4.

In one aspect, pattern P4 can comprise five LEDs 25 electrically connected in series across conductive pad 30. Pattern P4 can comprise a straight line of LEDs, and each of the five LEDs 25 can be positioned such that longer axes of LEDs 25 are substantially aligned along a straight line. In one aspect, longer axes of each LED 25 can be aligned in a same direction as the direction of wirebonds 26 connecting the LEDs 25 to conductive traces 33 and 34 disposed below retention material 14. Adjacent strings, e.g., adjacent strings in the second through twenty-ninth strings of LEDs 25 connected in pattern P4 can alternate above and below a straight line such that the LEDs 25 form a substantially checkerboard type arrangement. That is, a first string of LEDs 25 arranged in pattern P4 (i.e., the second overall string of LEDs 25 disposed below the first string comprising pattern P2) can comprise five LEDs 25 spaced equidistant apart, leaving a space in between adjacent LEDs 25. In the alternative, LEDs 25 in pattern P4 could be wirebonded in a checkerboard arrangement, but that could increase the voltage at which device 60 is operable. Below the first string of LEDs 25 arranged in pattern P4, a subsequent string of LEDs 25 arranged in pattern P4 can be positioned or placed such that the LEDs 25 are substantially within and/or slightly below the space between adjacent LEDs 25 of the preceding string. That is, LEDs 25 arranged in pattern P4 can comprise a first string aligned such that a bottom edge of each LED 25 in the string is aligned along a same first straight line. LEDs 25 in a neighboring subsequent string of pattern P4 can be aligned such that a top edge of each LED 25 is also aligned along the same first straight line as the bottom edge of LEDs 25 in the preceding string. Thus, LEDs 25 of preceding and subsequent strings alternate above and/or below spaces between adjacent LEDs 25 in a given string, and the top and bottom edges of LEDs 25 in adjacent strings can be aligned along a same line. This arrangement comprises a substantially checkerboard shaped orientation which can advantageously allow LEDs 25 to uniformly emit light from LED device 60 without one or more adjacent LEDs blocking light.

Additional strings of LEDs 25 arranged in pattern P4 can alternate according to the first two strings just described. Strings of LEDs 25 comprising pattern P4 can comprise a same or similar width over emission area 16. That is, each adjacent LED 25 of a given string can be spaced apart at equidistant lengths, but the overall string length may not be uniformly across emission area 16. Rather, LEDs 25 can be spaced such that the second to twenty-ninth rows form a substantially reticulated array over emission area 16. In one aspect, LEDs 25 form a rectangular array over emission area 16 which utilizes a substantially uniform portion of horizontal segments, or chords of conductive pad 30. In one aspect, LED device 60 can comprise at least one group of LEDs 25 arranged in more than one string of LEDs, where the overall configuration can be in a predetermined geometrical shape, such as for example and without limitation, a rectangle. Any suitable number of LEDs 25 may be connected in series. Fewer number of LEDs 25, for example five LEDs 25 connected in series as illustrated in FIG. 11 can allow LED device 60 to be suitable for lower voltage applications, for example 16V applications. For illustration purposes, 30 strings of five LEDs 25 arranged in one or more patterns are illustrated for operation at lower voltages, however, any suitable number of strings and/or LEDs 25 electrically connected in series is contemplated.

LED device 60 can comprise outermost LEDs 25A electrically connected via electrical connectors such as wirebonds 26 to conductive traces 33, 34 (FIG. 10). Retention material 14 can then be dispensed at least partially about conductive pad 30 and at least partially over wirebonds 26. Retention material 14 can be dispensed about emission area 16 which can comprise a plurality of LED chips, or LEDs 25 disposed within and/or below filling material 40 such as illustrated in FIG. 7. Filling material 40 can be at least partially contained by retention material 14, and retention material can be used to control or adjust various heights of filling material as may be desirable. Notably, LED device 60 can comprise a uniform optical source in the form of single, cohesive, and undivided emission area which can simplify the manufacturing process for manufacturers of light products requiring a single component. LEDs 25 can be spaced a suitable distance apart such that device 60 can advantageously emit uniform light without having any light blocked by one or more adjacent LEDs 25. The patterns and pattern spacing (i.e., spacing between adjacent LEDs 25 and spacing between adjacent strings of LEDs 25) disclosed for example in LED devices 10 and 60 allow for optimization of light extraction by reducing the amount of light blocked by adjacent LEDs 25 and adjacent strings of LEDs 25. The pattern spacing disclosed for example in LED devices 10 and 60 can further be configured and expanded, for example, by increasing the spacing between adjacent LEDs 25 (e.g., to pattern spacing illustrated in FIGS. 12-14B) to maximum spacing within a given string and between one or more strings to further maximize and attain a higher efficiency and light extraction within a given LED device.

Figure 12:
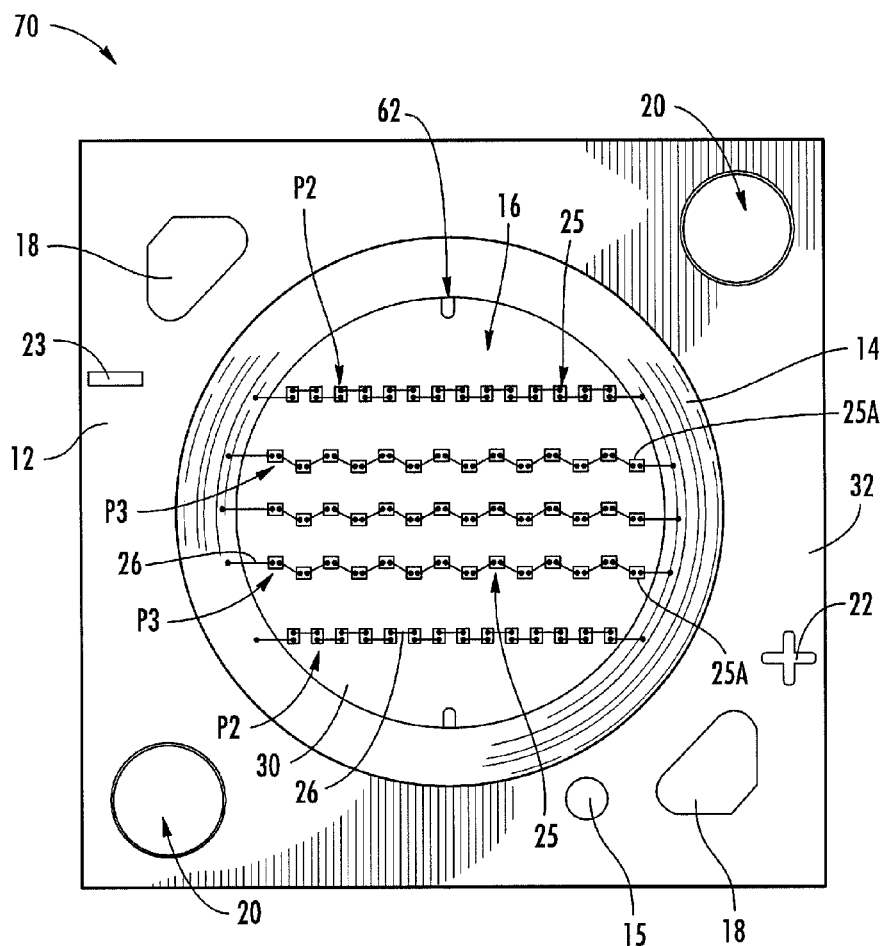

FIGS. 12 to 14B illustrate top views of LED devices which can be operable at higher voltages such as, for example only and not limited to approximately 42 V. In one aspect, LED devices illustrated by FIGS. 12 to 14B can comprise more than five LEDs 25 per string such that the device is configured to operate at greater than approximately 16 V. FIG. 12 illustrates an LED device generally designated 70 having, for example, five strings of 14 LEDs 25. LED device 70 can comprise strings of LEDs 25 arranged in one or more different patterns. For example, the first and last strings proximate rounded edges of conductive pad 30 can comprise 14 LEDs 25 arranged in previously described pattern P2. The longitudinal axes of adjacent LEDs 25 in pattern P2 can be aligned such that they are at least substantially parallel. The longitudinal axes of adjacent LEDs 25 in pattern P2 can be at least substantially perpendicular to the direction of wirebonds 26 connecting adjacent LEDs 25. For each LED device described, any shape, orientation, or structure of LEDs is contemplated. In one aspect, LED device 70 can comprise 70 total LEDs 25.

Still referring to FIG. 12, strings of LEDs 25 disposed between outermost strings of second pattern P2 can comprise a different pattern, for example, third pattern P3 previously described in FIGS. 3A and 3B. Third pattern P3 can comprise a substantially checkerboard pattern or arrangement of LEDs 25 electrically connected in series. In one aspect, pattern P3 can be disposed between and/or alternate with strings of LEDs having second pattern P2. The checkerboard pattern or third pattern P3 can comprise a set of LEDs 25 alternating both above and below a horizontal line. LED device 70 can be disposed uniformly across emission area 16 and/or conductive pad 30, for example. In general, adjacent LEDs 25 in each of the strings of LED device 70 can be spaced at equidistant intervals to utilize a substantial portion of horizontal segments of conductive pad 30. That is, LEDs 25 in device 70 can occupy a greater amount of surface area and length of horizontal segments of conductive pad 30 than previously described LED device 60. For illustration purposes, five strings of 14 LEDs 25 arranged in two different patterns are illustrated, however, any suitable number of strings and/or LEDs 25 electrically connected in series is contemplated.

Figure 13A:
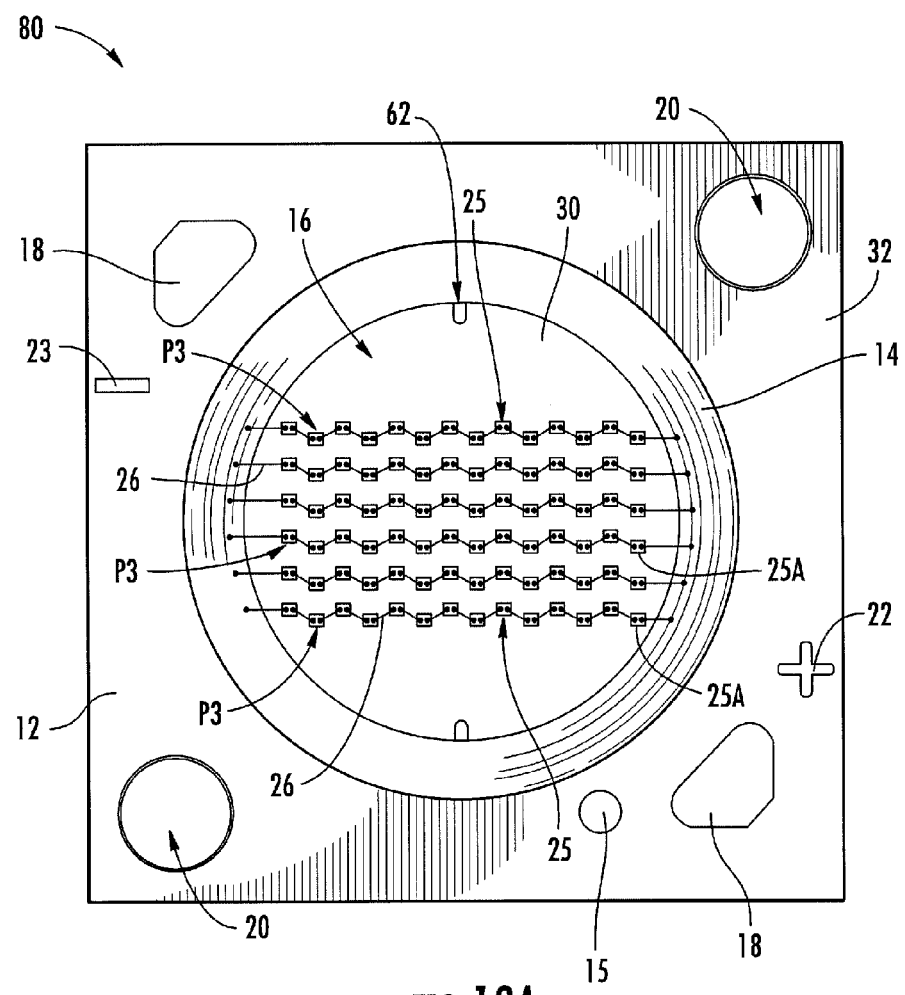
Figure 13B:
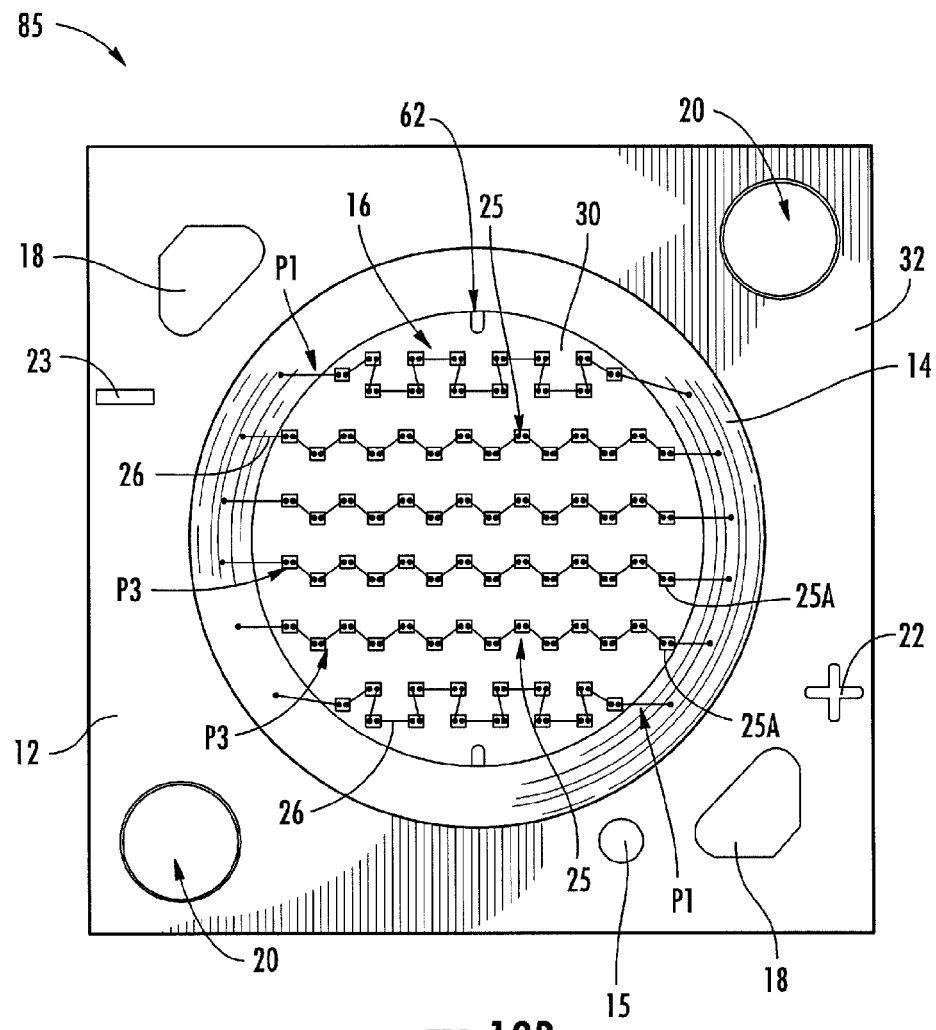

FIGS. 13A and 13B illustrate further embodiments of LED devices. In one aspect, LED devices in FIGS. 13A and 13B comprise six strings of 14 LEDs 25, for a total of 84 LEDs 25. Referring to FIG. 13A, LED device, generally designated 80 can comprise one or more strings of LEDs 25 arranged for example in a single pattern across conductive pad 30. The one or more strings of device 80 can have the same and/or different patterns. For illustration purposes, previously described pattern P3 is illustrated. LEDs 25 can be arranged in a checkerboard pattern alternating above and below a horizontal line. Adjacent LEDs 25 can be spaced a substantially uniform distance from each other across a large portion of the surface area of conductive pad 30. Checkerboard arrangements, e.g., pattern P3 can advantageously allow the LEDs 25 to uniformly emit light from LED device 80 without one or more adjacent LEDs 25 blocking light.

FIG. 13B illustrates another embodiment of a six string LED device, generally designated 85. Like LED device 80, LED device 85 can comprise six strings of 14 LEDs 25. Spacing between adjacent LEDs 25 within the same string and adjacent LEDs 25 within different strings has been maximized to minimize the amount of light absorbed by adjacent LEDs. In one aspect, LED device 85 comprises previously illustrated first pattern P1 (FIG. 3A) as the first and last strings. Notably, LEDs 25 of patterns P1 and P3 extend at least substantially the full length and width of conductive pad 30. The second through fifth strings of LEDs 25 within LED device 85 comprise pattern P3. When comparing the six string arrangement of FIG. 13A to the six string arrangement of FIG. 13B, it is apparent that the strings of FIG. 13B are more spread out, i.e., vertically and horizontally spaced further apart on conductive pad 30 to utilize more of the mounting area. Maximizing the space between strings of LEDs 25 can minimize the amount of light absorbed or blocked by neighboring LEDs 25.

In one aspect, inter-string spacing, that is, spacing between adjacent LEDs 25 of the same string has been increased by at least approximately 31%, or by 125 µm, or greater in the vertical direction for pattern P3 from LED device 80 to LED device 85. Similarly, inter-string spacing of LEDs 25 in pattern P1 has been increased and/or improved in both the horizontal and vertical directions. For example, spacing has been increased approximately 41%, or by 225 µm, or greater, in the horizontal direction and by at least approximately 27%, or by 210 µm, or greater in the vertical direction from P1 in LED device 10 to P1 in LED device 85. Intra-string spacing i.e., spacing between LEDs 25 of adjacent strings can be increased by at least approximately 68%, or by 750 µm, or greater in LED device 85. Notably, although LED device 85 can comprise the same number of LEDs 25 as LED device 80, e.g., 84 LEDs, LED device 85 can comprise at least approximately a 1% to 3%, or greater, increase in efficiency and brightness when compared to LED device 80. In one aspect, increasing the spacing between adjacent LEDs 25 as described can increase the efficiency by at least approximately 2.5% or greater from one six string arrangement to another, e.g., LED device 85 can comprise a 2.5% or greater increase in efficiency over LED device 80. For example, LED device 85 can have a light output of at least approximately 2.5% or higher than the light output of LED device 80 described above, which can comprise approximately 1050 lumens or more at 11 watts, or approximately 2000 lumens or more at 27 watts.

Figure 14A:
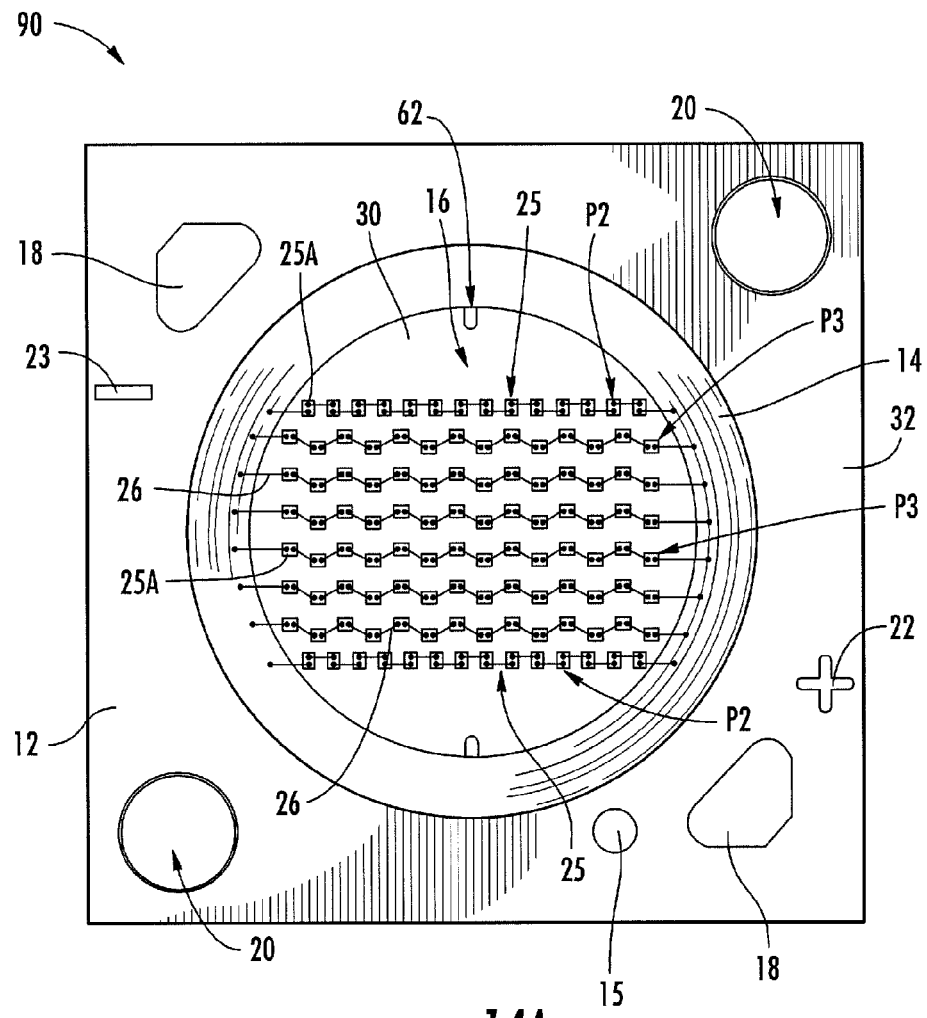
Figure 14B:
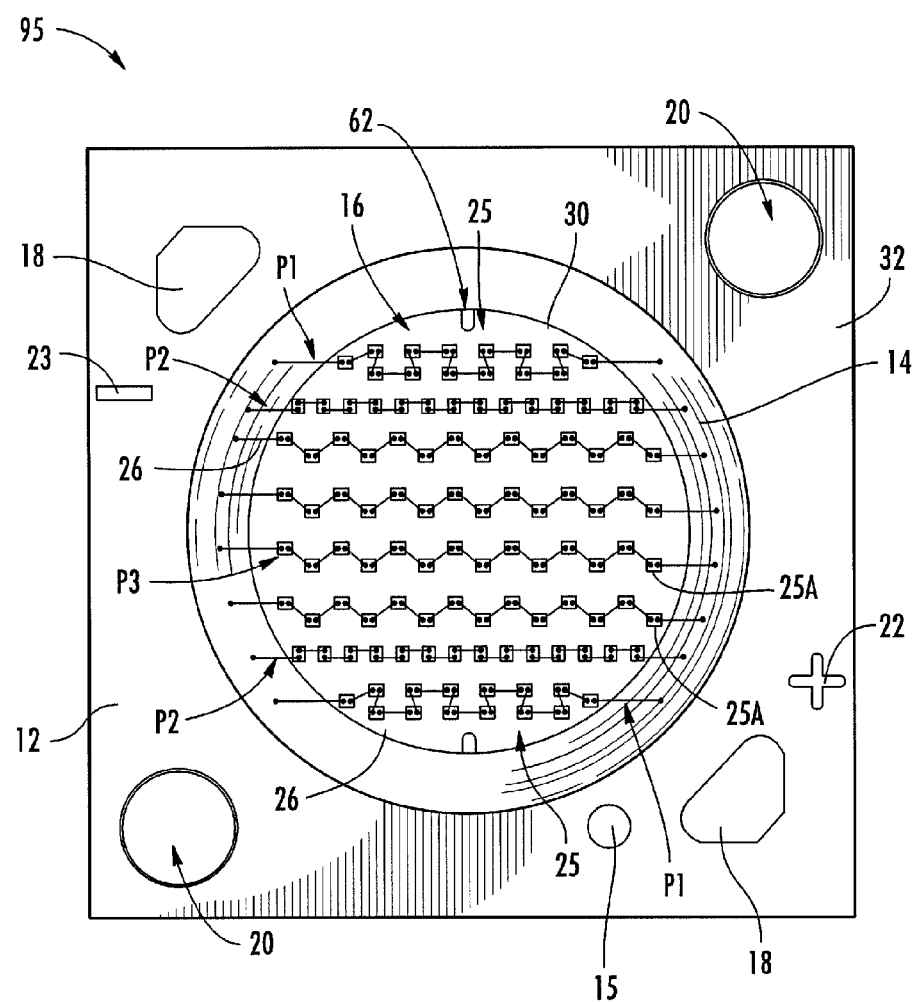

FIGS. 14A and 14B illustrate further embodiments of LED devices. In one aspect, the LED devices in FIGS. 14A and 14B comprise eight strings of 14 LEDs 25. Referring to FIG. 14A, an LED device generally designated 90 is illustrated, and can be operable at higher voltages, not limited to greater than or equal to approximately 42 V. LED device 90 can comprise one or more strings of LEDs 25 arranged in one or more patterns across emission area 16 and/or conductive pad 30. In one aspect, LED device 90 can comprise eight strings of LEDs 25 arranged in more than one pattern. Each string of LEDs 25 can comprise 14 LEDs 25, or 112 total LEDs. In one aspect, the first and last strings can comprise previously described pattern P2. The second through seventh strings of LEDs 25 can comprise previously described pattern P3. Notably, LED devices illustrated by FIGS. 11 to 14B can comprise a uniform optical source in the form of single, cohesive, and undivided emission area which can simplify the manufacturing process for manufacturers of light products requiring a single component.

FIG. 14B illustrates another embodiment of an eight string LED device, generally designated 95. Like LED device 90, LED device 95 can comprise eight strings of 14 LEDs 25. Spacing between adjacent LEDs 25 within the same string and adjacent LEDs 25 within different strings has been maximized to minimize the amount of light absorbed by adjacent LEDs. In one aspect, LED device 95 can comprise previously illustrated first pattern P1 (FIG. 3A) as the first and last strings. The second and seventh strings can comprise pattern P2, and the third through sixth strings can comprise pattern P3. Notably, LEDs 25 of patterns P1, P2, and P3 extend at least substantially the full length and width of conductive pad 30. LEDs 25 of P1, P2, and P3 can be spaced further apart horizontally and/or vertically such that an amount of light blocked by adjacent LEDs 25 can be decreased. In one aspect, pattern P1 spacing has been increased at least approximately 41%, or by 225 µm, or greater in the horizontal direction and by at least approximately 27%, or by 210 µm, or greater in the vertical direction from P1 in LED device 10 to P1 in LED device 95. Similarly, horizontal and/or vertical spacing between LEDs 25 in pattern P2 can be increased at least approximately 4% or greater over P2 in LED device 90. Intra-string spacing i.e., spacing between LEDs 25 of adjacent strings can be increased by at least approximately 68%, or by 750 µm, or greater in LED device 95. Notably, although LED device 95 can comprise the same number of LEDs 25 as LED device 90, e.g., 112 LEDs, LED device 95 can have at least an approximate 1% to 2%, or greater, increase in efficiency and brightness when compared to LED device 90.

In one aspect, LED devices 10, 50, 60, 70, 80, 85, 90 and 95 disclosed by FIGS. 3A, 3B, and 11 to 14B can comprise a large quantity of LEDs 25 arranged in one or more patterns over conductive pad 30. In one aspect, LED devices disclosed herein comprise a quantity of more than 64 LEDs 25. For example, in one aspect and without limitation, LED device 10 can comprise 140 total LEDs, or 10 strings of LEDs 25 electrically connected in series. LED device 60 can comprise 150 total LEDs, or 30 strings of five LEDs 25 electrically connected in series. LED device 70 can comprise 70 total LEDs, or five strings of 14 LEDs 25. LED device 80 can comprise 84 total LEDs, or six strings of 14 LEDs 25. LED device 90 can comprise 112 total LEDs, or eight strings of 14 LEDs 25. LEDs 25 used in LED devices described herein can comprise a small footprint, or surface area when compared to conductive pad 30. For example and without limitation, LEDs 25 can comprise chips of the following dimensions in Table 1 below:

TABLE 1

| LED chip size | |
|---|---|
| Length (µm) | Width (µm) |
| 350 | 470 |
| 230 | 660 |
| 500 | 500 |
| 520 | 700 |

In one aspect and without limitation, conductive pad 30 can comprise a radius of approximately 6.568 mm and an area of approximately 135.5 mm$^2$. Thus, the ratio of the area of a single LED chip 25 and the area of conductive pad 30 can comprise approximately 0.0027 or less. In one aspect, the ratio of the area of a single LED chip 25 and the area of conductive pad 30 can comprise approximately 0.0018 or less. In other aspects, the ratio can comprise approximately 0.0012 or less. Table 2 below lists various LED 25 chip sizes and the area of conductive pad 30. LEDs 25 can comprise chips that are small compared to the area of conductive pad, that is, approximately 0.0027 of the area of the conductive pad or less. Any chip size may be used however.

TABLE 2

| Chip Size (µm) | Conductive Pad Area (mm$^2$) | Ratio of Chip Area to Conductive Pad Area |
|---|---|---|
| 350 × 470 | 135.5 | 0.0012 |
| 230 × 660 | 135.5 | 0.0011 |
| 500 × 500 | 135.5 | 0.0018 |
| 520 × 700 | 135.5 | 0.0027 |

Using a large quantity of LEDs 25 comprising a smaller footprint over a single emission area can advantageously allow for more uniform light output in addition to desirable optical properties such as high brightness as the LEDs 25 can be arranged into one or more uniform patterns over a portion of emission area 16. The concentrated patterns of LEDs 25 can allow for concentrated light emission. In one aspect, the density or spacing of LEDs 25 in the one or more patterns described herein can be adjusted such that light will not be absorbed or blocked by adjacent LEDs 25. That is, patterns and arrangements of LEDs 25 disclosed herein may improve light extraction by minimizing the amount of light absorbed by adjacent or neighboring LEDs 25. The number of LEDs 25 per string can allow LED devices to be operable at low to high voltages. For illustration purposes, four patterns have been illustrated. However, any suitable pattern of LEDs 25 is contemplated. Each string of LEDs 25 can comprise a single pattern or a combination of more than one pattern.

Figure 15A:
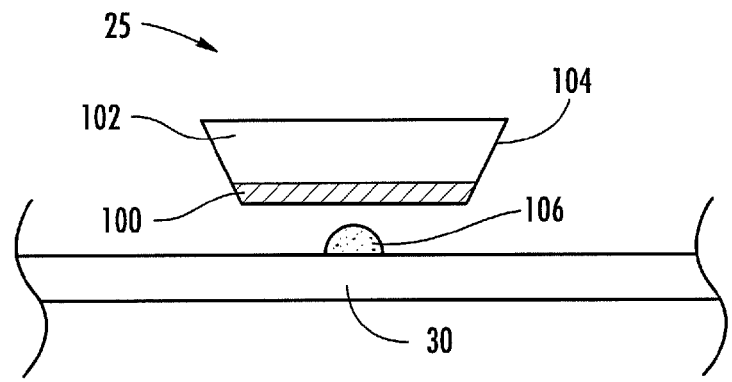
FIGS. 15A and 15B are views of die attach techniques used for LED devices according to the disclosure herein.
Figure 15B:
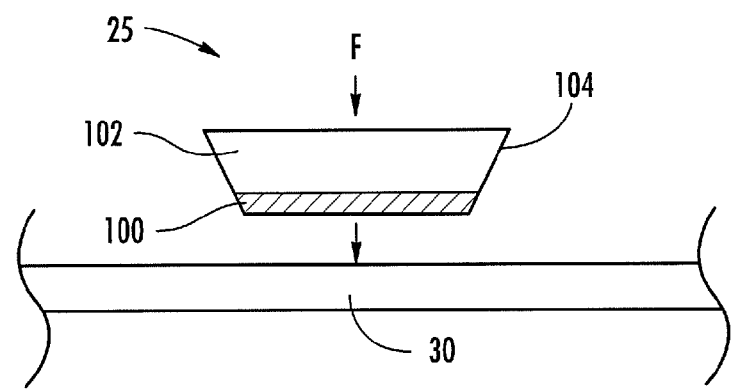

FIGS. 15A and 15B illustrate methods of die attach that can, for example and without limitation, be used for LED devices according to the disclosure herein. LED 25 can comprise a backside metal pad or bonding layer 100 for mounting over conductive pad 30. Bonding layer 100 can comprise a length of the entire bottom surface LED 25 or a portion thereof. For illustration purposes, bonding layer 100 is illustrated as having a same length as the entire bottom surface of LED 25, however, any configuration is contemplated. LED 25 can comprise lateral sides 104 which can extend between an upper surface and the bottom surface of LED 25. FIGS. 15A and 15B illustrate inclined lateral sides 104, however, lateral sides 104 can be substantially vertical or straight where a straight-cut LED is selected. FIGS. 15A and 15B illustrate LEDs 25 having an upper surface of a greater surface area than an area of bottom surface comprising bonding layer 100. However, upper surface can be of a smaller surface area than the surface area of bonding surface. LEDs 25 can comprise a square, rectangle, or any suitable shape in addition to having any suitable lateral side configuration.

Any suitable die attach method can be used to mount LED 25 over conductive pad 30 in any of the LED devices previously described. In one aspect, any suitable improved die attach method and/or materials can be used. For example, improved die attach methods can comprise metal-to-metal die attach methods for facilitating attachment of one or more metals on and/or between LED 25 and conductive pad 30. FIG. 15A illustrates an example of a metal-to-metal die attach method which can be eutectic or non-eutectic. This metal-to-metal die attach method can comprise using an assist material 106 to facilitate the metal-to-metal die attach. In one aspect, a flux-assisted eutectic metal-to-metal die attach method can be used and in other aspects a metal-assisted non-eutectic metal-to-metal die attach method can be used. In a flux-assisted eutectic, or flux eutectic, die attach method, bonding layer 100 can comprise a metal alloy having a eutectic temperature, for example, but not limited to, an alloy of gold (Au) and tin (Sn). For example, bonding layer 100 can comprise an 80/20 Au/Sn alloy having a eutectic temperature of approximately 280° C. In the flux eutectic technique, assist material 106 can comprise a flux material. In the non-eutectic technique, assist material 106 can comprise a metallic material as well as an adhesive such as silicone or epoxy. The assist material 106 can comprise a conduit for facilitating the metal-to-metal die attach between the bonding layer 100 and conductive pad 30 when the bonding layer 100 is heated above the eutectic temperature. The metal of bonding layer 100 can flow into and attach to the metal of conductive pad 30. The metal of bonding layer 100 or can atomically diffuse and bond with atoms of the underlying mounting conductive pad 30. In one aspect, flux used in a flux-assisted eutectic method can comprise a composition, for example, 55-65% rosin and 25-35% polyglycol ether in addition to small amounts of other components. Any suitable flux material can be used however.

Flux-assisted eutectic die attach methods can be tedious, and it is unexpected to use such methods when attaching a large quantity of LEDs 25 in predetermined arrangements and/or an array. Flux eutectic die attach according to the present subject matter can comprise dispensing flux assist material 106, that can be liquid at room temperature, in an amount to be precisely the right volume to avoid either floating of the LEDs 25 or poor die attach if too much or too little flux is used. Flux-assisted eutectic die attach according to the present subject matter can also require the right composition for each of the flux assist material 106 and bonding metal 100 of the emitter chips. Flux-assisted eutectic die attach according to the present subject matter can optimally utilize a very clean and flat surface and substrates or submounts that do not move or bend during heating and cooling such to stress the solder joint. Flux-assisted eutectic according to the present subject matter can utilize a fine surface roughness that is small enough not to encumber the Au/Sn bonding surface of the emitter chips while being rough enough to allow flux to escape during heating. The heating profile can be matched perfectly to the bonding metal 100, such as Au or AuSn, to ensure a good weld between the bonding metal 100 and underlying conductive pad 30. Using flux-assisted eutectic for die attach according to the present subject matter also can utilize an inert atmosphere, such as a nitrogen atmosphere, to reduce oxygen gas ($O_2$) levels and also allow gravity to apply a downward force on LEDs 25. This can reduce the amount of oxidation at the metal-to-metal bond between bonding layer 100 and underlying conductive pad 30.

Still referring to FIG. 15A, a non-eutectic metal-to-metal die attach method can be used which can also comprise an assist material 106, wherein the assist material 106 can comprise a metallic material. In this aspect, bonding layer 100 can comprise a single metal or a metal alloy. For example, bonding layer 100 can comprise Au, Sn, or AuSn. In non-eutectic methods, the bonding layer does not need to reach or exceed a temperature, for example, a eutectic temperature. In this aspect, assist material 106 can comprise a metallic, silicone, or epoxy material to facilitate the metal-to-metal bonding. For example, assist material 106 can comprise AuSn paste, Ag epoxy, or silicone adhesive. Any suitable assist or adhesive material 106 can be used. The metal of bonding layer 100 can attach to the metal of the assist material 106. The metal of the assist material 106 can also attach to the metal of conductive pad 30. In one aspect, a metal "sandwich" forms between bonding layer 100, assist material 106, and conductive pad 30 in non-eutectic metal-to-metal attach techniques where a metallic assist material 106 is used. Metal-assisted, non-eutectic die attach can be tedious, just as flux-assisted methods, and it is also unexpected to use such methods when attaching LEDs 25 within one or more patterns for LED devices described herein. Metal-to-metal attachment using an assist material 106 can be hard to control and tedious when attaching multiple small footprint LEDs within a device.

FIG. 15B illustrates a metal-to-metal die attach technique which does not require an assist material 106. One such method can comprise a thermal compression die attach method wherein the metal of bonding layer 100 will directly attach to the metal of conductive pad 30. The thermal compression method can be eutectic or non-eutectic. In one aspect, thermal compression can be used when bonding layer 100 comprises an alloy having a eutectic temperature. In other aspects, bonding layer 100 can comprise a metal not having a eutectic temperature. Conductive pad 30 can comprise any suitable metal, not limited to a Cu, Al, Ag, or Pt layer within a metal core printed circuit board (MCPCB). Bonding layer 100 comprises any suitable metal. In one aspect, bonding layer 100 can comprise a layer of Sn having any suitable thickness. In one aspect, bonding layer 100 can comprise a thickness greater than approximately 0 μm. In one aspect, bonding layer 100 can comprise a bonding layer equal to or greater than at least approximately 0.5 μm. In one aspect, bonding layer 100 can comprise a layer of Sn having a thickness of at least equal to or greater than approximately 2.0 μm. Unlike the flux-assisted eutectic or metal-assisted non-eutectic methods just described, thermal compression metal-to-metal die attach techniques can utilize an external downward force F as illustrated in FIG. 15B.

Force F can comprise a compression delivered in a heated environment, thus deemed a thermal compression, as opposed to dispensing a flux or metallic assist material 106. The thermal compression technique is an alternative die attach method developed to reduce metal squeeze out along the conductive pad 30 which can form Shottky or shunt defects and allow subsequent leakage of current and other various and related problems. In one aspect, the bonding temperature in thermal compression techniques can be approximately 255-265° C. after optionally subjecting conductive pad 30 to a pre-heat treatment or process. Conductive pad 30 can be heated to a mounting temperature of at least 20° C. above the melting temperature of the bonding layer 100. The bonding time can be approximately 300 msec and the bonding force can be approximately 50+/−10 grams (g). Predetermined settings can be important for this method, including adequate preheat, bonding temperature, bonding time, and bonding force. The equipment and predetermined settings for use with thermal compression methods can be difficult to use and/or maintain, and it is unexpected to use such methods when attaching a large quantity of LEDs 25 in an array and/or one or more patterns. Metal-to-metal methods for attaching an array of LEDs in LED devices is not known and is unexpected to use flux-assisted eutectic, metal-assisted non-eutectic, or thermal compression die attach techniques for attaching one or more strings of LEDs 25 in an array or pattern arrangement.

Figure 16:
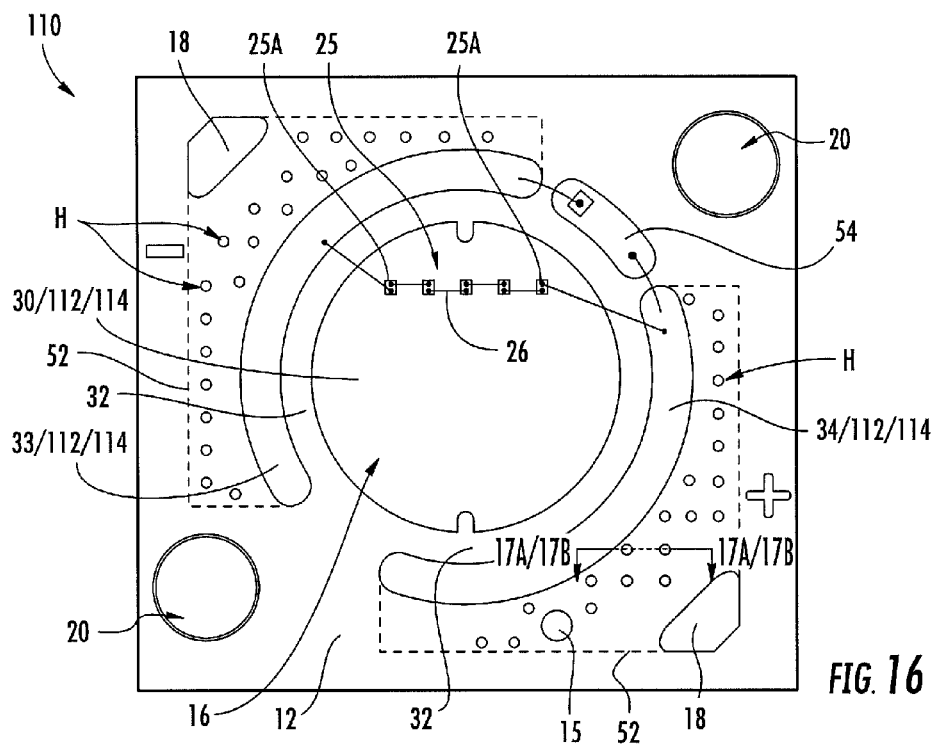
FIG. 16 is a top view of a light emitting device according to one embodiment of the disclosure herein.

FIG. 16 is a top view of a further embodiment or aspect of an LED device, generally designated 110. Device 110 can be similar in form and/or function to any of the devices (e.g., 10, 50, 55, 60, 70, 80, 85, 90, and/or 95) previously described herein. In one aspect, FIG. 16 can be similar to the device shown and described in FIG. 10, however FIG. 16 illustrates device 110 comprising one or more "anchor points" or holes H for providing improved adhesion within LED device 110. In one aspect, the one or more anchor points or holes H can comprise areas of material that have been partially or completely etched prior to application of the solder mask 32. Holes H facilitate better adhesion as solder mask 32 adheres better directly to dielectric layer 36 (FIGS. 17A and 17B) or Cu components (e.g., conductive pad 30 and traces 33, 34) than intervening reflective layers (e.g., 112 and 114, FIGS. 17A and 17B). For example, to improve brightness, one or more layers of intervening material, for example, a first layer 112 and a second layer 114 of material (FIGS. 17A and 17B) can be plated, deposited or otherwise disposed between one or more portions of solder mask 32 and conductive pad 30 and solder mask 32 and conductive traces 33 and 34.

First and second intervening layers 112 and 114 may comprise one or more layers of silver (Ag), titanium (Ti), or nickel (Ni) or other suitable metal. For example, first layer 112 may comprise a Ni barrier layer and second layer 114 can comprise a reflective Ag layer. In one aspect, Cu components (e.g., traces 33, 34 and pad 30) can have a thickness ranging, for example, from approximately 0.5 to 6 ounces (oz.) or approximately 17.5 to 210 μm. Any sub-range of thicknesses for Cu components is also contemplated, for example, 17.5-35 μm; 35-70 μm; 70-105 μm; 105-140 μm; 140-175 μm; and 175-210 μm. First layer 112 can have a layer of Ni of approximately 1 to 10 μm in thickness, and second layer 114 can have a layer of Ag of approximately 0.2 to 5 μm in thickness. In one aspect, first layer 112 can have a layer of electrolytic Ni that is approximately 1-1.3 μm; 1.3-1.8 μm, 1.8-2.5 μm; 2.5-5 μm; and 5-10 μm. In one aspect, second layer 114 can have a layer of electrolytic Ag that can, for example, be approximately 0.2-3 μm; 3-3.5 μm; and 3.5-5 μm. However, any range or sub-range of thicknesses for first and second layers 112 and 114, respectively, is also contemplated herein.

In one aspect, it may be more difficult to obtain adequate adhesion between solder mask 32 and intervening second layer 114 (e.g., where second layer 114 is a reflective layer comprised of Ag). Thus, areas of low adhesion could result between solder mask 32 and layer 114 which could result in premature loss of the solder mask 32 via flaking, chipping, or other such degradation. Notably, devices and methods described herein can advantageously improve adhesion, and therefore protect the electrical and optical properties of device 110, by forming one or more holes H within the reflective material (e.g., layer 114) prior to deposition of solder mask 32. In one aspect, solder mask 32 electrically isolates the electrical traces (e.g., traces 33, 34) from the environment. In one aspect, poor adhesion of solder mask 32 to underlying layers could result in solder mask 32 flaking or chipping off, which could no longer isolate the electrical traces and cause any light reflected back at the part to be re-reflected differently, thereby changing the optical properties of the part. Thus, better adhesion within device 110 can advantageously improve and/or provide good electrical isolation and optical properties. In one aspect, one or more holes H can be selectively and chemically etched. In one aspect, portions of first and second layers 112, 114, and optionally portions of conductive traces 33, 34 may be selectively removed via etching. Holes H can allow solder mask 32 to directly adhere to underlying dielectric layer 36 in instances where conductive traces 33, 34 comprised of Cu are etched. In the alternative, holes H can allow solder mask 32 to directly adhere to underlying Cu components (e.g., Cu traces 33, 34 and/or pad 30) in instances where holes H are not etched through the Cu. Holes H can improve adhesion within device 110. Optical properties of device 110 can also advantageously improve due to improved reflectivity of light from emission area 16 (e.g., via a layer of reflective Ag material such as second layer 114). Optical properties of device 110 can further be improved due to improved reflectivity of light from emission area 16 via solder mask 32 which can be very white and reflective.

The broken lines 52 of FIG. 16 illustrate one possible embodiment of the size and/or shape of the conductive material disposed within submount 12 which forms both the conductive traces 33 and 34 and attachment surfaces 18. For example, in one aspect, the broken lines 52 indicate the size and/or shape of a layer of conductive Cu, along with one or more of first and second layers of material 112 and/or 114 which may or may not be removed within submount 12, and which forms and electrically couples the conductive traces 33, 34 and attachment surfaces 18. The lines are broken to illustrate portions of the conductive Cu material that are disposed below solder mask 32. For example, some portions or areas of the conductive Cu layer can be exposed along an upper surface of submount 12 (e.g., conductive pad 30, conductive traces 33, 34, test point 15, and attachment surfaces 18) while other areas of conductive Cu may be disposed below solder mask 32 (e.g., areas within broken lines 52) and can therefore be disposed below the upper surface of submount 12. Similarly, where first and second layers 112 and 114 are deposited over Cu components (e.g., pad 30 and traces 33, 34) portions of the layers may be exposed along upper surface of submount 12 over conductive pad 30 and traces 33, 34 while other portions of first and second layers 112 and 114 can be disposed below solder mask 32 (e.g., areas within broken lines 52). That is, the exposed areas which are not covered by solder mask 32 can comprise a "stack" of one or more layers such as the Cu component, barrier, and Ag layers as indicated by the features labeled 34/112/114, 33/112/114 and 30/112/114. Thus, test point 15 and attachment surfaces 18 electrically and/or thermally communicate with respective conductive traces 33 and 34 and can comprise the same layer of material (e.g., Cu). When connected to an external driving circuit or power source, electrical current can flow from attachment surfaces 18 into electrically conductive traces 33 and 34 by flowing along the layer of material denoted by broken lines 52, and then the electrical current can flow into and illuminate the string of LEDs 25.

As noted above, one or more intervening layers of material, for example, first and/or second layers 112 and 114 of material (FIGS. 17A and 17B) can be deposited over the Cu material and can for example be the same shape as the Cu material (e.g., layers 112 and 114 can be confined within the boundaries of broken lines 52) for improving reflectivity of device 110. Solder mask 32 can further improve reflectivity of device 110 in areas where light is reflected back onto device 110. To increase adherence of solder mask 32, one or more holes H can be completely and/or partially etched through the each of layers 112, 114, and optionally Cu layers (e.g., traces 33, 34 and pad 30) prior to depositing solder mask 32 over areas designated by broken lines 52. Adhesion of solder mask 32 layer within device 110 can advantageously improve when it adheres directly to any of the Cu layers (e.g., traces 33, 34, and pad 30) or, preferably, directly to dielectric layer 36.

In one aspect, holes H are substantially circular; however, holes H can for example and without limitation be of any shape such as circles, squares, stars, symmetric polygons, asymmetric polygons, or combinations thereof. Holes H can be any size or shape and can be placed in any pattern and/or in any quantity to fit within a designated area underlying solder mask 32. For example, holes H can comprise a matrix, a grid pattern, a random pattern, disposed along the edges of a designated area (e.g., area within broken lines 52), or any combination thereof. Holes H can be randomly scattered, densely packed, sparsely packed, and/or positioned in combinations thereof. For example, holes H can have a diameter of approximately 1.5 to 10 times the thickness of the Cu components (e.g., traces 33, 34 and pad 30) and a period (e.g., spacing between holes H) that is approximately twice as deep as the holes H. For example, and in one aspect, Cu traces 34 can have a thickness of approximately 3 oz. (approximately 0.105 mm), and holes H can have a diameter of approximately 0.3 millimeters (mm) and a period, or inter-hole spacing of approximately 0.6 mm. Different ranges and sub-ranges of hole H period and depth are contemplated, but in general, holes H can have a period that is approximately 2 times the hole H depth, and holes H can have a diameter that is approximately 1.5 to 10 times thickness of the Cu components (which can range from approximately 0.5 to 6 oz., i.e., approximately 17.5 to 210 µm as described earlier).

In one aspect, holes H can comprise any suitable diameter, for example, ranging from 0.1 to 1 mm, including sub-ranges of approximately 0.1-0.2 mm; 0.2-0.4 mm; and 0.4-0.6 mm; 0.6-0.8 mm; and 0.8-1 mm. Holes H can comprise any suitable depth, for example and in one aspect, holes H can each comprise a depth of approximately 0 µm to 50 µm or approximately 50 µm to 500 µm and/or any sub-range thereof. For example, holes H can comprise a depth having any sub-range such as 0-50 µm; 50-100 µm; 100-200 µm; 200-300 µm, 300-400 µm, or 400-500 µm. Any size larger and/or smaller than the 50 to 500 µm range is also contemplated herein, for examples, holes H can comprise a depth of approximately 0-50 µm; 50-100 µm; 100-200 µm; 500-700 µm; 700-800 µm; or greater than approximately 800 µm. In one aspect, depth of holes H can correspond to the thickness of the Cu component (e.g., trace 34) and the first and second layers 112 and 114, for example, approximately 110 µm in some aspects or thicker for thicker components. Where only second layer 114 is etched, the depth of holes H could be as small as approximately 0.2 µm; thus, holes H can comprise a depth ranging from approximately 0.2 to 500 µm. Holes H of more than one size can be used together. In addition, holes H are not solely limited to placement between solder mask 32 and other underlying layers of submount 12, but could also be useful for improving adhesion between polymer coatings or layers and other layers disposed over/on devices such as silicones, epoxies, etc. Such uses are contemplated herein.

Figure 17A:
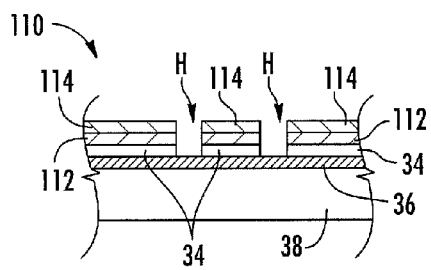
FIGS. 17A and 17B are cross-sectional views of the light emitting device according to FIG. 16.
Figure 17B:
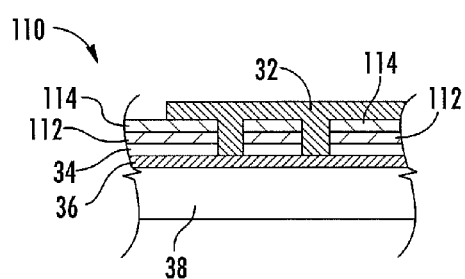

FIGS. 17A and 17B are cross-sectional views of the detail in FIG. 16. FIG. 17A illustrates the cross-section prior to deposition of solder mask 32, and FIG. 17B illustrates the cross-section after deposition of solder mask 32. As illustrated by FIGS. 17A and 17B, first and second intervening layers of material 112 and 114, respectively, can be deposited over the material comprising electrical trace 34. That is, first and second layers of material 112 and 114, respectively, can be plated or otherwise deposited over the entire area of Cu which forms and extends between trace 34 and attachment surface 18 and which is denoted by broken lines 52. In one aspect, first layer 112 comprises a barrier layer, for example electroplated Ni, and second layer 114 comprises a reflective layer, for example Ag electroplated over the Ni barrier layer. The Ag layer (e.g., layer 114) can advantageously improve brightness of device 110 while the Ni barrier layer (e.g., layer 112) can prevent Cu from migrating through and corroding the Ag layer (e.g., known as "red plague" corrosion which can degrade brightness). In one aspect, any other suitable barrier metal or layer instead of Ni may be used for first layer 112, and in some aspects first layer 112 (e.g., barrier layer) may be eliminated altogether. In further aspects, first layer 112 can comprise more than one layer of metals or alloys. In one aspect, solder mask 32 adheres well to dielectric material and relatively well to Cu (e.g., trace 34), however, it may not adhere well to Ag. Thus, to prevent the solder mask from flaking away or otherwise degrading, holes H can be etched through the first and second layers 112 and 114 (e.g., Ni and Ag) and optionally etched through the Cu as illustrated by FIGS. 17A and 17B.

Holes H act as anchor points for solder mask 32. FIG. 17B illustrates that upon deposition of solder mask 32, holes H provide areas where solder mask 32 can directly adhere to dielectric material 36. That is, solder mask 32 can flow into and become disposed inside holes H and directly adhere to an upper surface of dielectric material 36. This improves adherence of solder mask 32 to LED device 110. In addition to adhering to dielectric material 36, solder mask 32 can adhere directly to side portions of traces 34, first layer, 112, and second layer 114, each of which together form side walls for each of holes H. In an alternative embodiment where holes H are not etched through the Cu components (e.g., holes H terminate at conductive pad 30 and/or traces 33 and 34 as opposed to dielectric layer 36), solder mask 32 can flow into and become disposed inside holes H and directly adhere to an upper surface one or more Cu components such as conductive pad 30 and/or traces 33 and 34. Thus, solder mask 32 can adhere directly to side portions of first 112 and second layer 114 that together form side walls for each of holes H. In one aspect, dielectric layer 36 comprises a PCB dielectric material, for example, a thermally conductive dielectric layer. However, any suitable dielectric material may be used.

In an alternative embodiment, partial etching can be used to etch first and second layers 112 and 114 such that solder mask 32 can adhere directly to exposed Cu (e.g., trace 34) which can also provide for improved adhesion. Etching completely through the metals layers can expose small areas of dielectric material 36 thereby providing strong anchor points for securely affixing solder mask 32 to submount 12 even where other areas of adhesion between solder mask 32 and one or more metal layers (e.g., layer 114) may be weak. Anchor points or holes H can be designed to have any size, shape, and arrangement depending in part upon the shape of the area below solder mask 32. As noted above, holes H can be applied to any polymer layer to be applied over metal in MCPCB-based products (e.g., where submount 12 comprises a MCPCB). Notably, introduction of holes H into one or more layers of submount 12 can advantageously improve adhesion between solder mask 32 and layers of submount 12. This can improve electrical and optical properties of device 110 while improving brightness attributed to light reflected from the Ag layer 114.

Figure 18:
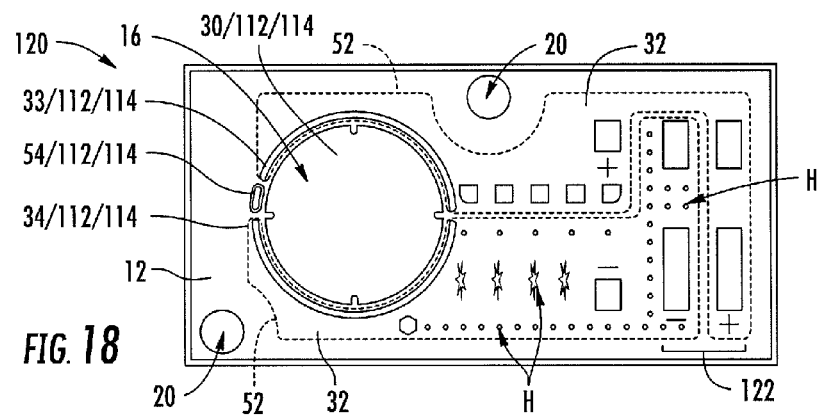
FIG. 18 is a top view of a light emitting device comprising a driver circuit according to the disclosure herein.

FIG. 18 illustrates a further embodiment of LED device, generally designated 120 which is similar in form and function to any of the previously described devices. FIG. 18 illustrates a LED device 120 having both an emission area 16 for producing light and a driving circuit, generally designated 122. Driving circuit 122 can be integrated with submount 12 for providing electrical power from an electrical power source to device 120. That is, device 120 does not have to be electrically connected to an external driving circuit as the circuit can be incorporated within submount 12. As illustrated, device 120 can include one or more holes H for providing anchor points such as, for example, between solder mask 32 and underlying layers of submount 12. In one aspect, holes H can be disposed along edges of the boundaries of conductive material (e.g., as indicated by broken lines 52). In other aspects, holes H can comprise star-shaped anchor points disposed in a middle portion of the conductive material disposed below solder mask 32, e.g., area 52. Holes H can be etched completely or partially through one or more layers of submount 12 thereby extending through one or metallic layers (e.g., 112, 114, 34) of device such that solder mask 32 adheres directly to an underlying dielectric layer 36 (FIG. 17B) thereby providing improved adhesion within device 112. This added adherence can prevent solder mask 32 from chipping or flaking from device 120 due to otherwise poor areas of adherence of solder mask 32.

Figure 19:
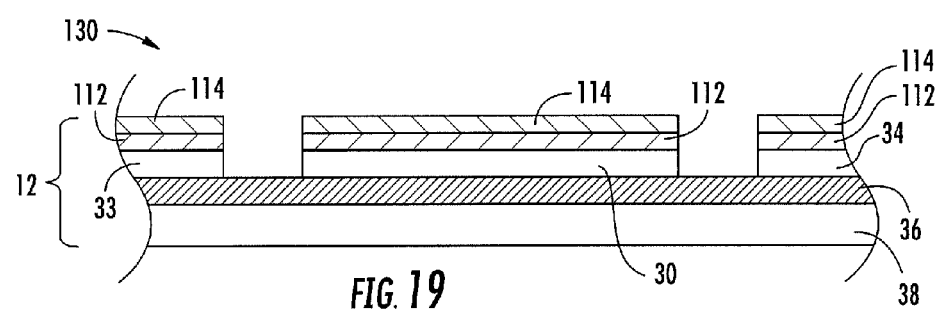
FIGS. 19 and 20 are cross-sectional views of a light emitting device according to the disclosure herein.

FIG. 19 is a cross-sectional view of a substrate 12 of an LED device, generally designated 130. LED device 130 can be similar in form and/or function to any of the previously described devices. The cross-sectional view disclosed by FIG. 19 is similar to the cross-sectional view shown and described in FIGS. 7 (and 17A and 17B), however, the view in FIG. 19 illustrates device 130 prior to deposition of a solder mask 32, prior to dispensing retention material 14, prior to the addition of filling material 40, each of which are illustrated in FIG. 7. In addition, FIG. 19 depicts one or more intervening layers between conductive pad 30 and solder mask 32 as well as between solder mask 32 and conductive traces 33 and 34.

FIG. 19 is an embodiment illustrating the various layers or metal/dielectric "stack" comprising substrate 12, where layers 112, 114 and Cu components (e.g., conductive pad 30 and traces 33, 34) have been completely separated via etching (i.e., etching downwardly from layer 114 to Cu layer until dielectric layer 36 is exposed as described further below). Subsequent devices 140, 150, and 160 shown and described in FIGS. 20 to 24 are also comprised of the layers of device 130; however, such devices may be subjected to further processing steps (e.g., additional etching before the final etch or abrading steps before or after etching) in order to improve solder mask 32 adhesion as described below.

As FIG. 19 illustrates, submount 12 of LED device 130 can comprise any suitable mounting submount or substrate, for example, a PCB, MCPCB, external circuit, or any other suitable submount or substrate over which lighting devices such as LEDs 25 (FIG. 20) may mount and/or attach. In one aspect, submount 12 can comprise a core layer 38, for example, a conductive metal layer such as Cu or Al. Submount 12 can further comprise dielectric layer 36, for example, an electrically insulating but thermally conductive layer of dielectric material disposed over core layer 38 to assist with heat dissipation through submount 12. Submount 12 can further comprise conductive pad 30 and first and second conductive traces 33 and 34 for supplying current to illuminate the one or more LEDs 25. Conductive pad 30 and first and second conductive traces 33 and 34 can comprise electrically and/or thermally conductive components or layers comprised of conductive materials. In one aspect and without limitation, conductive pad 30 and first and second conductive traces 33 and 34 can comprise Cu components that can be plated, layered, or otherwise deposited over dielectric layer 36. Cu components can be plated, layered, or otherwise deposited in a single layer and then subsequently etched to isolate conductive pad 30 from traces 33 and 34 as shown.

As FIG. 19 further illustrates, in one aspect one or more layers of material, for example, first layer 112 and second layer 114 of material can be deposited over Cu components such as conductive pad 30 and traces 33 and 34. In one aspect, first and second layers of material 112 and 114, respectively, can comprise layers of reflective, barrier, and/or adhesion promoting materials such as, for example and without limitation, one or more layers consisting of Ag, Ti, and Ni. For example and in one aspect, first layer 112 can be a Ni barrier layer and second layer 114 can be a reflective Ag or Ag alloy layer. Ag is a reflective material which can increase light output and therefore the optical performance of device 130 by increasing the amount of light reflected from the device. Solder mask 32 (FIGS. 20 to 24) can also comprise a reflective material for increasing light output and optical performance of devices described herein. First layer 112 can act as a barrier layer which prevents Cu from migrating into the Ag. First layer 112 can also prevent oxidation and/or discoloration of layer 114 where layer 114 comprises a layer of reflective Ag. As direct adhesion between solder mask 32 (FIGS. 20 to 24) and Ag (e.g., second layer 114) can be of a poorer quality than adhesion between solder mask 32 to other components (e.g., Cu components 30, 33, 34 and/or dielectric material 36), additional processing steps, for example, etching and/or abrading steps may be performed as described further below. In one aspect, solder mask 32 (FIGS. 20 to 24) can flake, chip, or degrade when applied directly to Ag (e.g., layer 114). Thus, additional etching and/or abrading steps may improve adhesion of devices described herein while increasing light output via second reflective layer 114.

Figure 20:
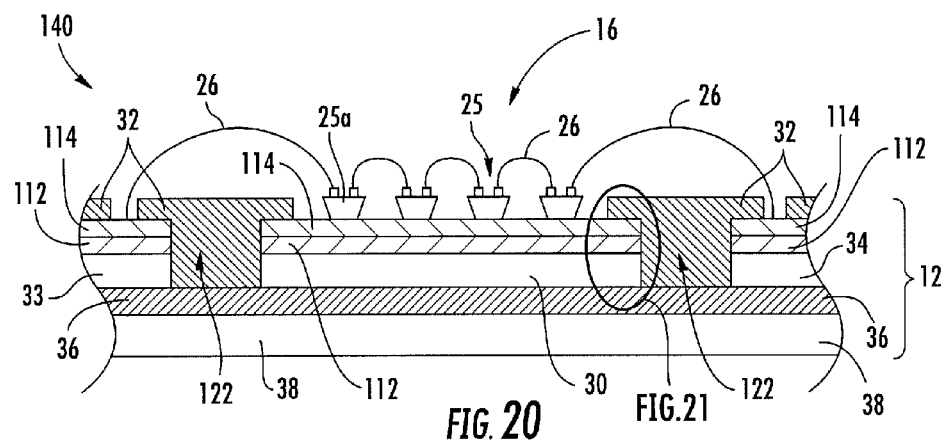
Figure 21:
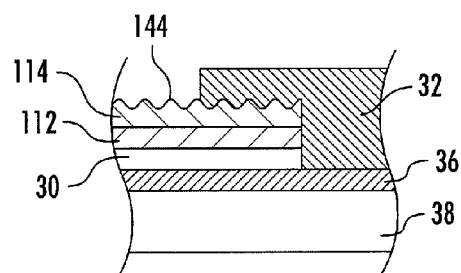
FIG. 21 is an exploded view of the detail in FIG. 20 illustrating one or more layers of material disposed below a layer of solder mask.

FIG. 20 and detail 21 illustrate a light emitting device or LED device, generally designated 140 where the second layer 114 has been partially etched to roughen the surface. FIGS. 20 and 21 also illustrate submount 12 further comprising solder mask 32 which has been applied over and/or between layers 112 and 114 and conductive components 30, 33, and 34 such that it can directly attach to one or more portions of dielectric layer 36. LED device 140 can comprise an emission area 16 where one or more LEDs 25 which can be in electrical and/or thermal communication with at least a portion of submount 12 and can be at least partially disposed under a filling material (e.g., not shown, see filling material 40 FIG. 7). Filling material 40 of FIG. 7 can be dispensed within emission area 16 after one or more layers of submount 12 have been etched and solder mask 32 has been applied. That is, filling material 40 can be added after die attach, wirebonding, and retention material 14 have been added. In this embodiment, first and second layers 112 and 114 can be patterned across a Cu layer to substantially align with and cover the Cu. This can assure adequate reflectance from conductive surfaces of device 140. One or more gaps 122 can be created via etching portions of layers 112 and 114 and Cu components (i.e., etching downward, first etching layer 114, then layer 112, then separating Cu layer into pad 30 and traces 33, 34) thereby creating spaces for solder mask 32 material to extend into during deposition of solder mask 32. Of note, even where gaps 122 are present between one or more portions of layers 112 and 114, solder mask 32 can overlap or extend slightly and directly over portions of second layer 114 to allow for slight variations in mask registration.

Solder mask 32 can be deposited in one or more gaps 122 formed between Cu components (e.g., 30, 33, and 34) and first and second layers 112 and 114 and indirectly over conductive pad 30 and first and second conductive traces 33 and 34. Solder mask 32 can comprise any one of many solder mask materials available in the marketplace, such as PSR-4000 WT02 manufactured and distributed by Taiyo Ink Mfg. Co., Ltd. headquartered in Japan. As illustrated, first and second layers 112 and 114 of reflecting and/or barrier material are disposed between LEDs 25 and conductive pad 30. Layers 112 and 114 are also disposed between portions of solder mask 32 and each of conductive pad 30 and conductive traces 33 and 34. For illustration purposes, two intervening layers (e.g., 112 and 114) are shown, however, any number of intervening layers, for example, a single layer and/or more than two layers could also be deposited between solder mask 32 and conductive pad 30. In addition, first and second layers 112 and 114 can comprise more than one thin layer of material.

FIG. 21 is an exploded view of the detail circled in FIG. 20, and illustrates devices and methods for improving adhesion between solder mask 32 and underlying second layer 114. For example and in one aspect, an upper surface 144 of second layer 114 may be chemically and/or mechanically abraded to roughen the surface, thereby improving adhesion. As illustrated, solder mask 32 can directly adhere to portions of dielectric layer 36 and/or portions of second layer 114. As noted earlier and in one aspect, it may be more difficult to obtain adequate adhesion between solder mask 32 and intervening second layer 114 (e.g., where second layer 114 comprises Ag) as opposed to direct adhesion between solder mask 32 and Cu components (e.g., direct adhesion between portions of solder mask 32, pad 30, and traces 33 and 34, see FIG. 7) or direct adhesion between solder mask 32 and dielectric layer 36. That is, adhesion between solder mask 32 and dielectric layer 36 can be superior compared to adhesion between solder mask 32 and other metallic layers. Of the metallic layers, adhesion between solder mask 32 and Cu components (e.g., traces 33, 34 and pad 30) can be superior as compared to adhesion between solder mask 32 and Ag (e.g., layer 114). Thus, areas of low adhesion could result between solder mask 32 and layer 114 which could adversely affect electrical and/or optical performance of the device. Notably, roughening upper surface 144 of second layer 114 can advantageously improve adhesion within device 140 while optical properties of device 140 can also improve due to improved reflectivity of light from emission area 16 (e.g., via a layer of reflective Ag material such as second layer 114).

In one aspect, second layer 114 can comprise a layer of reflective material such as electrolytic Ag. In this aspect, upper surface 144 of layer 114 can be roughened to improve adhesion to portions of solder mask 32. The term "roughened" can be characterized as substantially non-smooth, and/or having one or more pits, lips, a rough surface texture and/or surface variations. The roughening can be performed just prior to application of solder mask 32 and can provide pits and lips that a lower surface of solder mask 32 can form around and/or into thereby providing traction and preventing flaking. For example, upper surface 144 of second layer 114 can be roughened thereby forming lips or pits (denoted by the wavy texture) and a portion of the lower surface of solder mask can adhere about the texturized upper surface 144 as illustrated in FIG. 21. In one aspect, upper surface 144 of layer 114 can be mechanically and/or chemically abraded to increase adhesion to solder mask 32.

In one aspect, upper surface 144 can be mechanically abraded using any suitable technique, for example and without limitation, at least one of a sandblasting, bead-blasting, brushing, scrubbing, chipping, eroding, micro-abrading, and/or scoring technique to roughen the surfaces. In other aspects, upper surface 144 can be chemically abraded using any suitable technique, for example and without limitation, at least one of a partial etching, vaporizing, and/or chemically eroding technique to roughen the surface. The roughening surface treatment can for example be applied after plating layer 114 and either before or after etching the metal features (e.g., etching shape designated by broken lines 52 in previously described Figures), after which the solder mask 32 is applied. Roughening upper surface 144 of the Ag layer (e.g., layer 114) can provide for an increased surface texture such that lower surface 132 of solder mask 32 can adapt to the texture and thereby provide a better "grip" on the surface. This can prevent solder mask from chipping, flaking, or being generally displaced.

Figure 22:
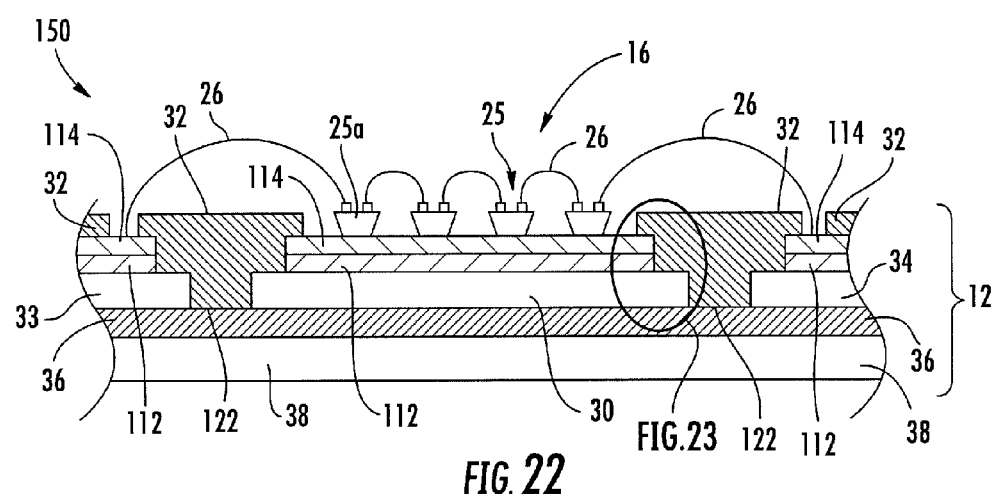
FIG. 22 is a cross-sectional view of a light emitting device according to the disclosure herein.

FIG. 22 is a cross-section illustrating a further embodiment of an LED device, generally designated 150, where differential etching of first and second layers 112 and 114 and Cu layers (e.g., pad 30 and traces 33, 34) is illustrated. That is, multiple etching steps can be used to result in portions of solder mask 32 adhering directly to Cu components (e.g., traces 33, 34 and pad 30) as opposed to solely adhering to the top surface of layer 114 (e.g., reflective layer). Also, in devices and methods described herein, solder mask 32 adheres directly to dielectric layer 36 via gaps 122 between Cu components (e.g., pad 30 and traces 33, 34). This can further improve adhesion within submount 12 as solder mask 32 adheres better to each of dielectric layer 36 and Cu components than Ag, and can thereby improve adhesion properties of device 150. Of note, a small amount of solder mask 32 may overlap over first layer 114 to allow for slight variations in mask registration. Also of note, a small amount of solder mask 32 can adhere directly to one or more sides of first and second layers 112 and 114, and/or Cu components including pad 30 and traces 33, 34 via sidewalls of gaps 122.

In one step, a first photomask can be applied and patterned in a shape the same as or slightly larger than the area to be exposed in the final product. The first etching step can remove only portions of first and second layers 112 and 114 (e.g., Ag and/or Ni, where a Ni barrier layer is used) and can leave behind the exposed Cu layer. As stated previously, other metals may be used as a barrier layer, or the barrier layer may be eliminated altogether. After the first etch, a second photomask patterned in the shape of the normal electrical traces (e.g., 33, 34, and pad 30) can be applied and the Cu alone (e.g., pad 30 and traces 33, 34) can be etched to expose portions of the dielectric layer 36. As a result of the differential etching, electrical traces 33, 34 and pad 30 extend in length and/or are of a greater area than the reflective layer (e.g., first layer 114) and/or a barrier layer (e.g., layer 112) where a barrier layer is present. The first layer 112 of barrier material and the second layer 114 of reflective material can for example be approximately the same dimensions. This allows solder mask 32 to directly adhere to portions of the Cu layer (e.g., pad 30 and traces 33, 34) and dielectric layer 36, to which it has good adhesion as opposed to adhering to second layer 114 (e.g., Ag) to which it has poor adhesion. The result is first and second layers of Ni and Ag (e.g., layers 112 and 114) only in areas exposed in the final product (e.g., as an exposed surface of submount 12) so that solder sits directly on portions of Cu components (e.g., pad 30 and traces 33, 34) and dielectric layer 36 rather than Ag (e.g., second layer 114).

Figure 23:
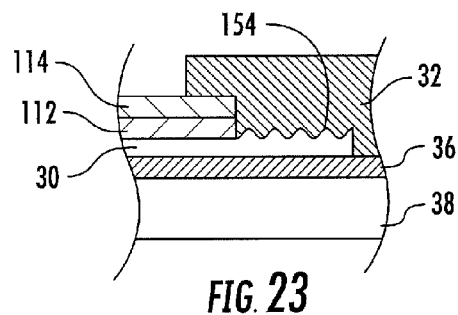
FIG. 23 is an exploded view of the detail in FIG. 20 illustrating one or more layers of material disposed below a layer of solder mask.

FIG. 23 is an exploded view of the detail circled in FIG. 22, and illustrates an optional step and/or structure that can be used in conjunction with the differentially etched embodiment described in FIG. 22. The optional step of abrading a surface of the Cu components (e.g., pad 30 and traces 33, 34) can further improve adhesion between solder mask 32 and an underlying Cu component such as conductive pad 30. For example and in one aspect, an upper surface 154 of conductive pad 30 can be mechanically or chemically abraded using any suitable technique described herein to improve adhesion between portions of solder mask 32 and conductive pad 30. For illustration purposes, only conductive pad 30 is shown in detail, however, upper surfaces of other Cu components including traces 33 and 34 could also be abraded to improve adhesion between the components and solder mask 32.

In one aspect, upper surface 154 can be mechanically abraded using least one of a sandblasting, bead-blasting, brushing, scrubbing, chipping, eroding, micro-abrading, and/or scoring technique to roughen the surfaces. In other aspects, upper surface 154 can be chemically abraded using any suitable technique, for example and without limitation, at least one of a partial etching, vaporizing, and/or chemically eroding technique to roughen the surface. The roughening surface treatment can for example be applied after plating layer 30 and etching the metal features (e.g., etching shape designated by broken lines 52 in previously described Figures) and just before application of solder mask 32. Roughening upper surface 154 of conductive pad 30 can provide for an increased surface texture such that a lower surface of solder mask 32 can adapt to the texture and thereby provide a better "grip" on the surface. This can prevent solder mask from chipping, flaking, or becoming generally displaced.

Figure 24:
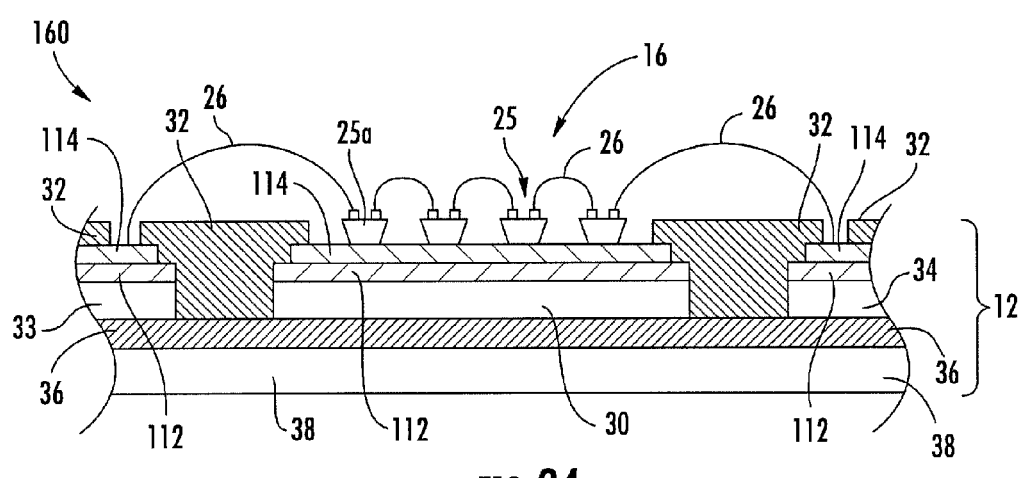
FIG. 24 is a cross-sectional view of a light emitting device according to the disclosure herein.

FIG. 24 illustrates another embodiment of differential etching within an LED device, generally designated 160, for improving adhesion within the device. That is, multiple etching steps can be used to result in portions of solder mask 32 adhering directly to portions of an underlying Ni layer (e.g., layer 112) as opposed to solely adhering to layer 114 (e.g., reflective layer) when applied over the metal areas. In both cases, solder mask 32 adheres directly to dielectric layer 36 via gaps 122 between the Cu components (e.g., pad 30 and traces 33, 34). This can further improve adhesion within submount 12 as solder mask 32 adheres better to each of dielectric layer 36 and Ni components than Ag, and can thereby improve adhesion properties of device 160. Of note, a small amount of solder mask 32 may overlap over first layer 114 to allow for slight variations in mask registration.

LED device 160 can comprise an area 16 disposed over submount 12, where emission area 16 comprises one or more LEDs 25 electrically and/or thermally communicating with at least a portion of submount 12 and can be at least partially disposed under a filling material (e.g., filling material 40, FIG. 7) after performing the etching steps described herein. As previously described and in one aspect, first layer 112 can comprise a barrier layer of electrolytic Ni deposited between reflective second layer 114 and conductive pad 30 and between reflective second layer 114 and first and second conductive traces 33 and 34. In this aspect, second layer 114 can comprise a layer of reflective electrolytic Ag or Ag alloy that can be electroplated or deposited over first layer 112, prior to application of solder mask 32 as illustrated in FIG. 19. First layer 112 can prevent discoloration, degradation, and/or oxidation of layer 114 where layer 114 is a layer of Ag or Ag alloy. First layer 112 can also prevent migration of underlying Cu of conductive pad 30 and traces 33 and 34 from migrating into first layer 114. Notably, the optical performance of device 160 can improve in part because of the addition of second layer 114, where second layer comprises a reflective layer, such as a reflective layer of Ag.

In one step, a first photomask can be applied and patterned in a shape the same as or slightly larger than the area to be exposed in the final product. The first etching step can fully remove portions of second layer 114 (e.g., Ag) and can leave behind the exposed first layer 112 and underlying Cu layer (e.g., pad 30 and traces 33, 34) such that first layer 112 and underlying Cu layer are of a substantially same dimension and extend further in width than second layer 114. After the first etch, a second photomask patterned in the shape of the normal electrical traces (e.g., 33, 34, and pad 30) can be applied and the Ni and Cu (e.g., first layer 112, pad 30, and traces 33, 34) can be fully etched to expose portions of the dielectric layer 36. As a result of the differential etching, first layer 112 and underlying Cu layers extend in length and/or are of a greater area than the reflective layer (e.g., first layer 114). This allows solder mask 32 to directly adhere to portions of the Ni first layer 112 and portions of dielectric layer 36, to which it has good adhesion as opposed to adhering to electroplated first layer 114 (e.g., Ag) to which it has poor adhesion. The final result is second layers of Ag (e.g., 114) only in areas exposed in the final product (e.g., as an exposed surface of submount 12) so that solder sits directly on portions of Ni barrier layer (e.g., first layer 112) and dielectric layer 36 rather than Ag (e.g., second layer 114). In different embodiments, another result of the differential etching can undercut in first and second layers 112 and 114 such that Cu layers extend in length less than and/or are of a lesser area than the reflective layer (e.g., first layer 114).

Notably, any combination of devices and methods shown and described in FIGS. 1 to 24 is also contemplated herein. For example and in one aspect, anchor holes H shown and described in FIGS. 16 to 18 can be used either alone and/or in combination with the differential etching steps shown and described above in FIGS. 19 to 24. Such devices are within the scope of this disclosure.

Embodiments of the present disclosure shown in the drawings and described above are exemplary of numerous embodiments that can be made within the scope of the appended claims. Improving adhesion between one or more layers within LED devices can maintain good electrical isolation and optical properties. It is contemplated that the configurations of LED devices and methods of making the same can comprise numerous configurations other than those specifically disclosed.

What is claimed is:

1. A method of providing a light emitting device, the method comprising:
   providing a submount for supporting one or more light emitting diodes (LEDs);
   wherein providing the submount comprises:
      depositing a conductive layer;
      depositing a reflective layer over the conductive layer;
      forming at least one hole in the reflective layer; and
      depositing a layer of solder mask over the reflective layer such that at least a portion of the solder mask is disposed in the at least one hole.

2. The method of claim 1, wherein depositing the conductive layer comprises depositing a copper (Cu) layer.

3. The method of claim 1, wherein depositing the reflective layer comprises depositing a silver (Ag) layer.

4. The method of claim 1, further comprising depositing a barrier layer between the conductive layer and the reflective layer.

5. The method of claim 4, wherein depositing the barrier layer comprises depositing a nickel (Ni) layer.

6. The method of claim 1, wherein forming the at least one hole comprises chemically etching the hole.

7. The method of claim 1, etching the hole comprises etching the reflective layer such that the hole terminates at an upper surface of the conductive layer.

8. The method of claim 1, further comprising a dielectric layer.

9. The method of claim 8, wherein forming the at least one hole comprises chemically etching the reflective layer and the conductive layer, such that the reflective layer and the conductive layer together form a sidewall of the hole.

10. The method of claim 9, wherein the at least one hole terminates at an upper surface of the dielectric layer.

11. The method of claim 1, further comprising forming a plurality of holes in the reflective layer.

12. The method of claim 11, wherein forming the plurality of holes comprises forming a matrix of holes.

13. The method of claim 11, wherein forming the plurality of holes comprises forming a random pattern of holes.

14. The method of claim 11, wherein forming the plurality of holes comprises forming the plurality of holes along an edge of the reflective layer.

15. The method of claim 11, wherein forming the plurality of holes comprises forming at least one of a circle, square, star, asymmetric shaped hole, or combinations thereof.

16. The method of claim 1, wherein forming the at least one hole comprises chemically etching at least one hole having depth ranging between approximately 0.2 and 500 micrometers ($\mu$m).

* * * * *